United States Patent
Kuramochi

(10) Patent No.: US 12,183,661 B2
(45) Date of Patent: *Dec. 31, 2024

(54) THROUGH ELECTRODE SUBSTRATE AND SEMICONDUCTOR DEVICE

(71) Applicant: DAI NIPPON PRINTING CO., LTD., Tokyo (JP)

(72) Inventor: Satoru Kuramochi, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/214,216

(22) Filed: Jun. 26, 2023

(65) Prior Publication Data

US 2023/0335465 A1 Oct. 19, 2023

Related U.S. Application Data

(63) Continuation of application No. 17/070,374, filed on Oct. 14, 2020, now Pat. No. 11,728,243, which is a
(Continued)

(30) Foreign Application Priority Data

Sep. 5, 2016 (JP) .................. 2016-172606

(51) Int. Cl.
*H01L 23/48* (2006.01)
*B23K 26/382* (2014.01)
(Continued)

(52) U.S. Cl.
CPC .......... *H01L 23/481* (2013.01); *B23K 26/382* (2015.10); *C03C 17/3671* (2013.01);
(Continued)

(58) Field of Classification Search
CPC . H01L 23/481; H01L 21/76873; H01L 23/32; H01L 23/49822; H01L 23/49827;
(Continued)

(56) References Cited

U.S. PATENT DOCUMENTS 8,119,920 B2 * 2/2012 Inagaki ................. H05K 1/144
174/262
9,159,648 B2 * 10/2015 Koizumi ............... H01L 21/486
(Continued)

FOREIGN PATENT DOCUMENTS

| CN | 102300820 A | 12/2011 |
|---|---|---|
| CN | 105765712 A | 7/2016 |

(Continued)

OTHER PUBLICATIONS

Oct. 3, 2017 International Search Report issued in International Patent Application No. PCT/JP2017/029276.
(Continued)

*Primary Examiner* — Niki H Nguyen
(74) *Attorney, Agent, or Firm* — Oliff PLC

(57) ABSTRACT

A through electrode substrate includes a substrate having a through hole extending through between a first face and a second face, a diameter of the through hole not having a minimum value inside the through hole; and a conductor arranged inside the through hole, wherein the through hole has a shape having a value obtained by summing a first to an eighth inclination angle at a first to an eighth position, respectively, of an inner face of the through hole of 8.0° or more, each of the first to the eighth inclination angle is an angle of the inner face with respect to a center axis of the through hole, and the first to the eighth position correspond to positions at distances of 6.25%, 18.75%, 31.25%,
(Continued)

Shape A 43.75%, 56.25%, 68.75%, 81.25%, and 93.75%, respectively, from the first face in a section from the first face to the second face.

18 Claims, 26 Drawing Sheets

Related U.S. Application Data continuation of application No. 16/293,272, filed on Mar. 5, 2019, now Pat. No. 10,847,444, which is a continuation of application No. PCT/JP2017/029276, filed on Aug. 14, 2017.

(51) Int. Cl.

| | | |
|---|---|---|
| C03C 17/36 | (2006.01) | |
| C03C 17/40 | (2006.01) | |
| C03C 23/00 | (2006.01) | |
| H01L 21/768 | (2006.01) | |
| H01L 23/32 | (2006.01) | |
| H01L 23/498 | (2006.01) | |
| H01L 23/52 | (2006.01) | |
| H01L 23/532 | (2006.01) | |
| H01L 29/40 | (2006.01) | |
| C03C 15/00 | (2006.01) | |
| H01L 23/00 | (2006.01) | |
| H01L 23/15 | (2006.01) | |

(52) U.S. Cl.
CPC .......... *C03C 17/40* (2013.01); *C03C 23/0025* (2013.01); *H01L 21/76873* (2013.01); *H01L 23/32* (2013.01); *H01L 23/49822* (2013.01); *H01L 23/49827* (2013.01); *H01L 23/5329* (2013.01); *C03C 15/00* (2013.01); *H01L 23/15* (2013.01); *H01L 24/09* (2013.01); *H01L 24/17* (2013.01); *H01L 24/49* (2013.01); *H01L 24/73* (2013.01)

(58) Field of Classification Search
CPC ... H01L 23/5329; H01L 23/15; H01L 224/17; H01L 24/49; H01L 24/73; H01L 24/48; H01L 2224/73265; H01L 24/45; H01L 24/29; H01L 2224/73204; H01L 2924/15311; H01L 2224/16227; H01L 2224/48465; H01L 2224/49113; H01L 23/3114; H01L 2924/00012; H01L 24/81; H01L 24/85; H01L 2225/06541; H01L 21/486; H01L 2224/02166; H01L 2224/0603; H01L 2224/83203; H01L 23/3171; H01L 23/48; H01L 2225/06517; H01L 2225/0651; H01L 23/5389; H01L 23/49816; H01L 2224/02371; H01L 2224/04026; H01L 2224/48137; H01L 2225/1058; H01L 2224/04105; H01L 2224/13022; H01L 2224/16; H01L 23/5226; H01L 2224/05008; H01L 2224/16237; C03C 17/3671; C03C 23/0025; C03C 15/00
See application file for complete search history.

(56) References Cited

U.S. PATENT DOCUMENTS

| | | | |
|---|---|---|---|
| 9,431,347 B2* | 8/2016 | Kunieda | H01L 23/5381 |
| 10,028,393 B2* | 7/2018 | Shimizu | H01L 25/105 |
| 10,847,444 B2* | 11/2020 | Kuramochi | H01L 21/76873 |
| 11,728,243 B2* | 8/2023 | Kuramochi | H01L 23/49827 257/774 |
| 2008/0067073 A1 | 3/2008 | Kagawa et al. | |
| 2011/0232948 A1 | 9/2011 | Sato et al. | |
| 2011/0256344 A1 | 10/2011 | Ono et al. | |
| 2013/0247615 A1 | 9/2013 | Boek et al. | |
| 2014/0144681 A1 | 5/2014 | Pushparaj et al. | |
| 2016/0276257 A1* | 9/2016 | Kuramochi | H05K 3/28 |
| 2017/0358447 A1 | 12/2017 | Tsunetomo et al. | |

FOREIGN PATENT DOCUMENTS

| | | |
|---|---|---|
| JP | H04-154187 A | 5/1992 |
| JP | H08-512171 A | 12/1996 |
| JP | 2003-218518 A | 7/2003 |
| JP | 2005-123546 A | 5/2005 |
| JP | 2006-24652 A | 1/2006 |
| JP | 4012375 B2 | 11/2007 |
| JP | 2011-54907 A | 3/2011 |
| JP | 2011-178642 A | 9/2011 |
| JP | 2011-205069 A | 10/2011 |
| JP | 2013-157386 A | 8/2013 |
| JP | 2014-501686 A | 1/2014 |
| JP | 2014-78720 A | 5/2014 |
| JP | 2014-093406 A | 5/2014 |
| JP | 2014-139963 A | 7/2014 |
| JP | 2014-212183 A | 11/2014 |
| JP | 2015-002262 A | 1/2015 |
| JP | 2015-095590 A | 5/2015 |
| JP | 2015-103586 A | 6/2015 |
| JP | 2015-146410 A | 8/2015 |
| JP | 2016-49542 A | 4/2016 |
| JP | 2016-63114 A | 4/2016 |
| JP | 2016-157982 A | 9/2016 |
| JP | 2016-213253 A | 12/2016 |
| JP | 7239045 B2 | 3/2023 |
| TW | 201625501 A | 7/2016 |
| WO | 9530178 A1 | 11/1995 |
| WO | 2010/087483 A1 | 8/2010 |
| WO | 2012/075072 A2 | 6/2012 |
| WO | 2015/076301 A1 | 5/2015 |

OTHER PUBLICATIONS

Oct. 3, 2017 Written Opinion of the International Searching Authority issued in International Patent Application No. PCT/JP2017/029276.
Mar. 13, 2018 Japanese Office Action issued in Patent Application No. 2016-172606.
Apr. 17, 2018 Notice of Allowance issued in Japanese Patent Application No. 2016-172606.
Jun. 12, 2018 Notice of Allowance issued in Japanese Patent Application No. 2018-095168.
Kuramochi et al., "Advanced Interposers with Metalized Through Via" 2015 European Microelectronics Packaging Conference (EMPC), Sep. 14, 2015.
Apr. 13, 2020 Office Action issued in U.S. Appl. No. 16/293,272.
Jun. 2, 2020 Office Action issused in Japanese Patent Application No. 2018-129161.
Jul. 20, 2020 Notice of Allowance Issued in U.S. Appl. No. 16/293,272.
Aug. 24, 2021 Notice of Written Submission of Information including Written Submission of Information filed by a third party against Japanese Patent Application No. 2020-200248.
Jul. 20, 2021 Notice of Dispatch of Duplicates of a Written Opposition including Written Opposition and Statement of Evidence filed by a third party against Japanese Patent No. 6809511.
Sep. 6, 2021 Office Action issued in Taiwanese Patent Application No. 106128939.
Sep. 21, 2021 Notice of Reasons for Revocation issued in Japanese Patent No. 6809511.
Oct. 19, 2021 Office Actrion issued in Japanes Application No. 2020-200248.
Nakamura et al., "Micro-Laser Drilling on Glass substrates with Pulsed CO2 lasers." Proceedings of 2013 JSPE Spring Conference,

(56) References Cited

OTHER PUBLICATIONS

The Japan Society for PrecisionEngineering, 2013, pp. 587-588. DOI:https://doi.org/10.11522/pscjspe.2013S.0. 587.0.
Yonemura et al., "Through holes formation in multi component glass substrates by laserassisted etching." Proceedings of the 62nd JSAP Spring Meeting, 2015, The Japan Society of Applied Physics, p. 17-157, 12p-B6-8.
Feb. 17, 2022 Notice of Sending a Duplicate of Written Opinion including Written Opinion filed by a third party against JP Patent No. 6809511.
Feb. 17, 2022 Decision on Opposition dispatched on for JP Patent No. 6809511.
Dec. 16, 2022 Office Action issued in U.S. Appl. No. 17/070,374.
Nov. 14, 2022 Office Action issued in Taiwanese Patent Application No. 111113098.
Mar. 28, 2023 Notice of Allowance Issued in U.S. Appl. No. 17/070,374.
Apr. 23, 2024 Office Action issued in Japanese Patent Application No. 2023-031648.
Dec. 20, 2023 Office Action issued in Taiwanese Patent Application No. 112138577.
Oct. 22, 2024 Notice of Written Submission of Information against Japanese Application No. 2023-031648.
Oct. 22, 2024 Written Submission of Information filed by a Third Party against Japanese Application No. 2023-031648.
Oct. 29, 2024 Office Action issued in Japanese Application No. 2023-031648.

\* cited by examiner

Shape A

Shape B

Shape A1

Shape A2

Shape A3

Shape A4

Shape A5

Shape B1

Shape B2

Shape B3

Shape B4

Shape C

Shape D

Shape C1

Shape C2

Shape C3

Shape C4

Shape D1

Shape D2

Shape D3

Shape D4

Shape E1

THROUGH ELECTRODE SUBSTRATE AND SEMICONDUCTOR DEVICE

CROSS REFERENCE TO RELATED APPLICATIONS

This application is a U.S. continuation application of Ser. No. 17/070,374 filed on Oct. 14, 2020, which in turn is a U.S. continuation application of Ser. No. 16/293,272 filed on Mar. 5, 2019, which in turn is a U.S. continuation application filed under 35 U.S.C. § 111(a), of International Application No. PCT/JP2017/029276, filed on Aug. 14, 2017, which claims priority to Japanese Patent Application No. 2016-172606, filed on Sep. 5, 2016, the disclosures of which are incorporated by reference.

FIELD

The present disclosure relates to a through electrode substrate.

BACKGROUND

In recent years, a three-dimensional mounting technique of stacking semiconductor circuit substrates formed with integrated circuits perpendicularly has been used. Such a mounting technique, a substrate formed with a through electrode has been used. Such a substrate may be also called interposer. The through electrode is formed by arranging a conductor in a through hole formed in the substrate. In order to achieve high integration, fining of the through hole is required. For example, in PTL 1 (International Publication WO2010/087483), and PTL 2 (Japanese Patent Application Publication No. 2014-501686), a technique of irradiating a glass substrate with a laser beam is disclosed in order to form a fine through hole.

SUMMARY

According to one embodiment of the present disclosure, a through electrode substrate includes a substrate having a first face and a second face; the substrate having a through hole extending through between the first face and the second face, a diameter of the through hole not having a minimum value inside the through hole; and a conductor arranged inside the through hole, wherein the through hole has a shape having a value obtained by summing a first inclination angle to an eighth inclination angle at a first position to an eighth position; respectively, of an inner face of the through hole of 8.0° or more, each of the first inclination angle to the eighth inclination angle is an angle of the inner face with respect to a center axis of the through hole, and an angle expanding toward the first face is defined as a positive; and the first position to the eighth position correspond to positions at distances of 6.25%, 18.75%, 31.25%, 43.75%, 56.25%, 68.75%, 81.25%, and 93.75%; respectively, from the first face in a section from the first face to the second face.

DESCRIPTION OF EMBODIMENTS

Figure 1:
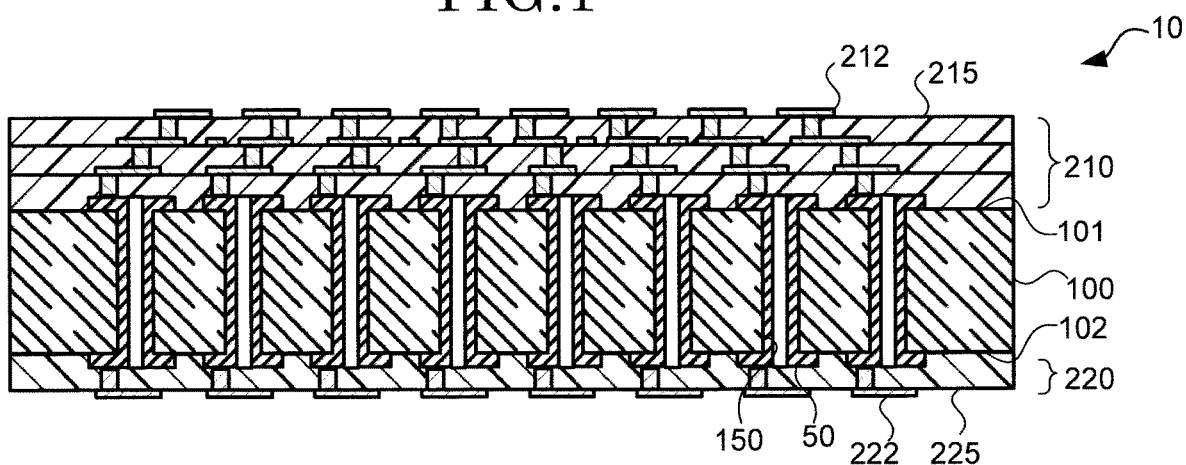
FIG. 1 is a view illustrating a cross-sectional structure of a through electrode substrate in a first embodiment of the present disclosure.

Through electrode substrates according to respective embodiments of the present disclosure are described in detail below with reference to the drawings. It is to be noted that each embodiment shown below is an example of an embodiment of the present disclosure, and the present disclosure should not be interpreted as being limited to these embodiments. It is to be noted that, in the drawings referred to in the present embodiment, the same portion or a portion having a similar function is denoted by the same reference sign or similar sign (a numerical sign only followed by A, B, C, or the like) and repeated description thereof may be omitted. In addition, a size ratio in the drawings may be different from an actual ratio, or a portion of a configuration may be omitted from the drawings for the convenience of description.

First Embodiment

Configuration of Through Electrode Substrate

FIG. 1 is a view illustrating a cross-sectional structure of a through electrode substrate according to a first embodiment of the present disclosure. A through electrode substrate 10 includes a glass substrate 100 and wiring layers 210, 220. The wiring layer 210 is arranged on a first face 101 side of the glass substrate 100. The wiring layer 220 is arranged on a second face 102 side of the glass substrate 100. The glass substrate 100 is provided with through holes 150 extending through from the first face 101 to the second face 102. A through electrode 50 is a conductor arranged inside the through hole 150 and a portion of the glass substrate 100 on the first face 101 side and a portion thereof on the second face 102 side. The through electrode 50 electrically connects the first face 101 side and the second face 102 side of the glass substrate 100. The wiring layer 210 includes a conduction layer 212 and an insulation layer 215. The wiring layer 220 includes a conduction layer 222 and an insulation layer 225. The conduction layer 212 and the conduction layer 222 are electrically connected to each other through the through electrode 50. It is to be noted that at least one or both of the wiring layer 210 and wiring layer 220 may not be present.

In FIG. 1, a shape of the through hole 150 appears to be a cylindrical shape, but actually an inner face of the through hole 150 has a complicated shape. This also applies to illustrations of FIGS. 2 to 8. It is to be noted that, regarding a specific shape of the through hole 150, shapes shown in FIGS. 9, 10, 22, 23, 24 described later are exemplified.

Method for Manufacturing Through Electrode Substrate

Subsequently, a manufacturing method for the through electrode substrate 10 is described with reference to FIG. 2 to FIG. 8. First of all, a step of forming the through hole 150 in the glass substrate 100 is described.

Figure 2:
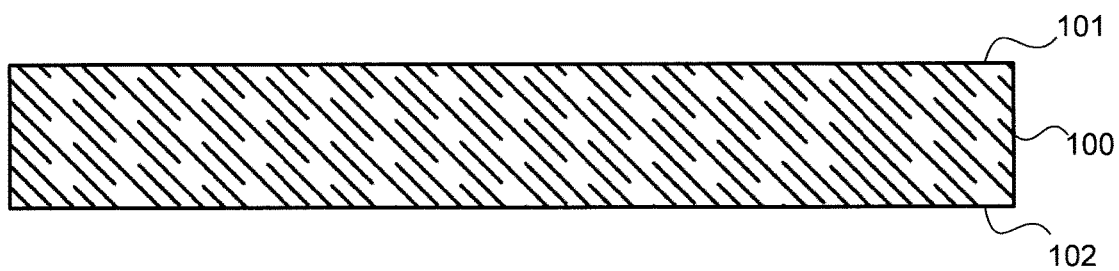
FIG. 2 is a view illustrating a manufacturing method for the through electrode substrate in the first embodiment of the present disclosure.
Figure 3:
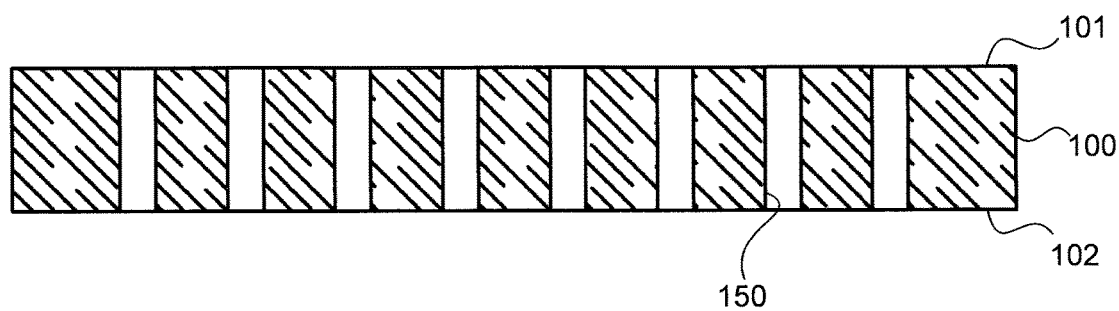
FIG. 3 is a view illustrating a manufacturing method for the through electrode substrate following FIG. 2 (formation of a through hole).

FIG. 2 is a view illustrating a manufacturing method for a through electrode substrate according to the first embodiment of the present disclosure. FIG. 3 is a view illustrating a manufacturing method for the through electrode substrate following FIG. 2 (formation of a through hole). The glass substrate 100 is first prepared (FIG. 2). A thickness of the glass substrate 100 is 400 μm in this example. Instead of the glass substrate 100, a substrate formed from another inorganic material, such as a quartz substrate, a silicon wafer, or a ceramic, may be used, or a substrate formed from an organic material, such as a resin substrate, may be used. When a substrate having conductivity, such as a silicon wafer, is used, a substrate surface including the inner face of the through hole is covered with an insulator in order to prevent the through electrode and the substrate from being electrically continuous with each other with the through hole formed therein.

Subsequently, the through hole 150 is formed in the glass substrate 100 (FIG. 3). The through hole 150 is formed such that the inner face thereof has any one of the shapes shown in FIGS. 9, 10, 20, 21, 22, as described above. In this example, the shape of the through hole 150 satisfies either one of first conditions and second conditions described below.

First Conditions

The first conditions include conditions shown in the following items (1) and (2).

(1) A diameter Sd does not have a minimum value inside the through hole 150.

(2) A value (a total value) obtained by summing inclination angles at a plurality of measurement points in the inner face of the through hole 150 is 8.0° or more.

Here, the plurality of measurement points correspond to positions at distances of 6.25%, 18.75%, 31.25%, 43.75%, 56.25%, 68.75%, 81.25%, and 93.75% from the first face 101 in a section from the first face 101 to the second face 102 (eight points in total: from a first position to an eighth position).

Second Conditions

The second conditions include conditions shown in the following items (3), (4), (5).

(3) The diameter Sd has a minimum value inside the through hole 150.

(4) A value obtained by summing inclination angles at a plurality of first measurement points in the inner face of the through hole 150 (a first total value) is 4.0° or more.

(5) A value obtained by summing inclination angles at a plurality of second measurement points in the inner face of the through hole 150 (a second total value) is −4.0° or less.

Here, the plurality of first measurement points correspond to positions at distances of 6.25%, 18.75%, 31.25%, and 43.75% from the first face 101 in a section from the first face 101 to the second face 102 (four points in total: from the first position to the fourth position). The plurality of second measurement points correspond to positions at distances of 56.25%, 68.75%, 81.25%, and 93.75% from the first face 101 in a section from the first face 101 to the second face 102 (four points in total: from the fifth position to the eighth position).

Definitions of the respective terms described above are described. The inside of the through hole 150 refers to between the first face 101 and the second face 102 of the glass substrate 100 in the through hole 150. The diameter Sd of the through hole 150 refers to a distance from a center axis of the through hole 150 to the inner face in a cross-sectional shape perpendicular to the center axis. The diameter Sd varies according to a position of the section perpendicular to the center axis. In this example, the cross-sectional shape is circular. Therefore, the diameter Sd corresponds to a radius. Further, the center axis is located at a center of the circle. In addition, in this example, the center axis of the through hole 150 is perpendicular to the first face 101 and the second face 102. The inclination angle is an inclination angle of the inner face with respect to the center axis of the through hole 150. The inclination angle at which the first face 101 side expands takes a positive value.

The through hole 150 satisfying the first conditions is formed by irradiating the glass substrate 100 with a laser light under a predetermined condition. The through hole 150 satisfying the second condition is formed by performing an etching process using predetermined etching liquid after irradiating the glass substrate 100 with a laser light under the predetermined condition. The maximum value of the diameter Sd approximately ranges from 35 μm to 45 μm. As described above, the thickness of the glass substrate 100 is 400 μm. Therefore, an aspect ratio (a ratio of a length of the through hole 150 (the thickness of the glass substrate 100) to a diameter of the through hole 150 (a maximal value of the diameter Sd×2)) is about 5. It is desired that the above-described first conditions or second conditions are applied to the through hole 150 having the aspect ratio of 4 or more. Regarding the through hole 150 satisfying either the first conditions or the second conditions, a detailed processing condition thereof is described in each example described later.

Subsequently, a step of forming the through electrode 50 in the through hole 150 is described.

Figure 4:
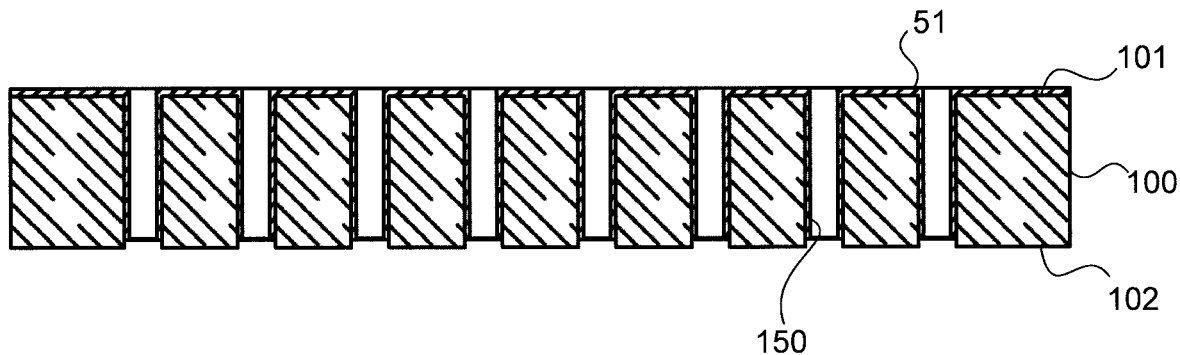
FIG. 4 is a view illustrating a manufacturing method for the through electrode substrate following FIG. 3 (formation of a first metal layer).
Figure 5:
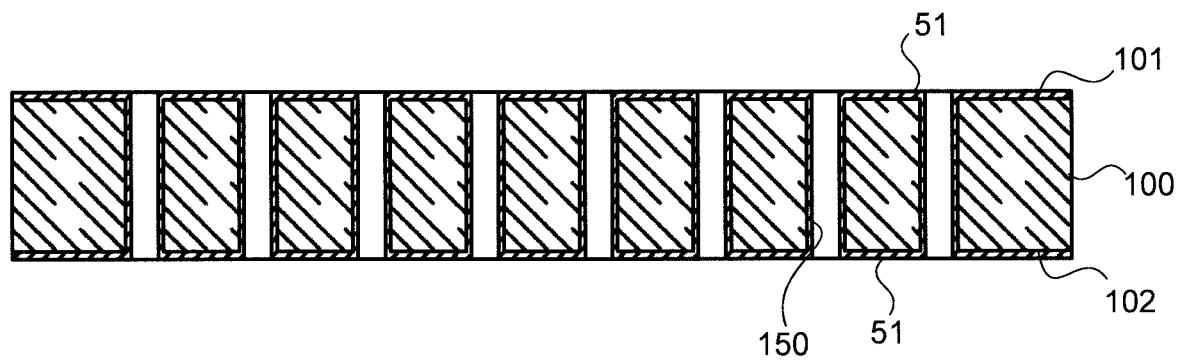
FIG. 5 is a view illustrating a manufacturing method for the through electrode substrate following FIG. 4 (formation of the first metal layer).
Figure 6:
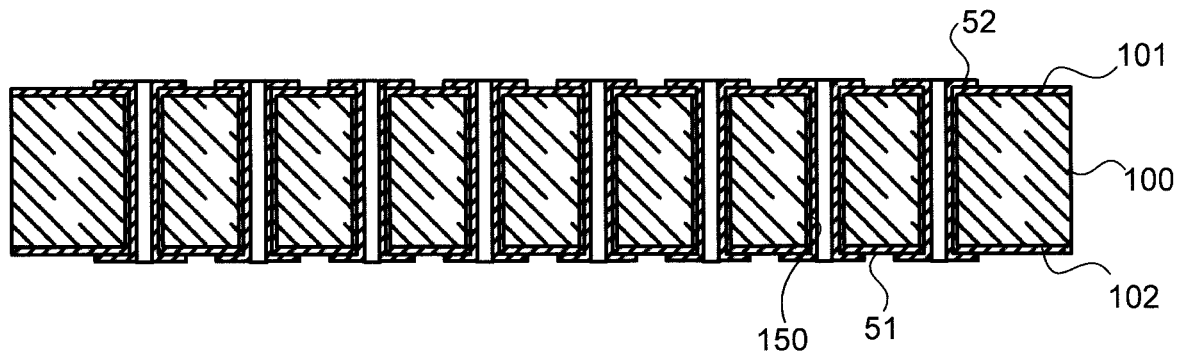
FIG. 6 is a view illustrating a manufacturing method (formation of a second metal layer) of the through electrode substrate following FIG. 5.
Figure 7:
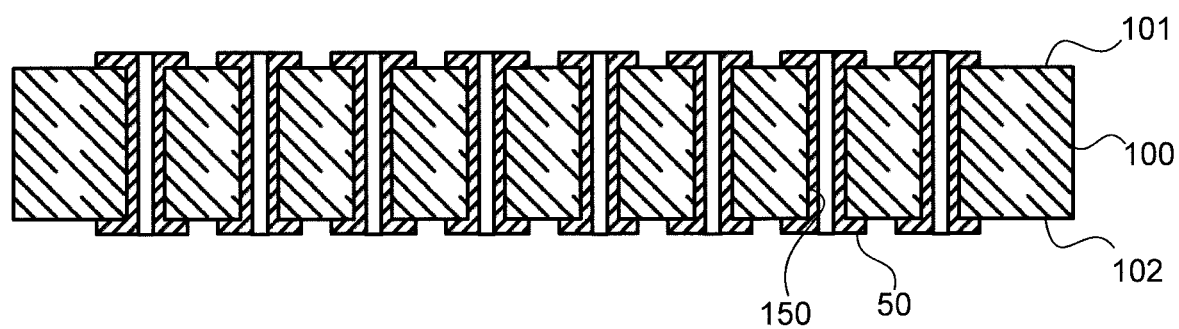
FIG. 7 is a view illustrating a manufacturing method for the through electrode substrate following FIG. 6 (formation of the through electrode).

FIG. 4 is a view illustrating a manufacturing method (formation of a first metal layer) for the through electrode substrate following FIG. 3. FIG. 5 is a view illustrating a manufacturing method for the through electrode substrate following FIG. 4 (formation of the first metal layer). FIG. 6 is a view illustrating a manufacturing method for the through electrode substrate following FIG. 5 (formation of a second metal layer). FIG. 7 is a view illustrating a manufacturing method for the through electrode substrate following FIG. 6 (formation of the through electrode).

A first metal layer 51 is formed on the glass substrate 100 formed with the through hole 150. The first metal layer 51 has a function of a seed layer for an electroplating process. The first metal layer 51 is made from Ti. It is to be noted that the first metal layer 51 may be made from a metal functioning as a seed layer for the electroplating process, and may be made from; for example, a metal containing Cu, Ni, Cr, Ti, or IN, or the like.

The first metal layer 51 is first formed by a sputtering technique on the first face 101 side of the glass substrate 100 (FIG. 4). In this example, the first metal layer 51 is deposited by the sputtering technique on the first face 101 side while the glass substrate 100 is being rotated. A rotation axis of the glass substrate 100 is inclined to a normal line of the first face 101. It is desired that an inclination angle of the rotation axis be equal to or more than 0° and equal to or less than 20°, and it is 10° in this example. It is to be noted that a normal line of a surface of a target used in sputtering is parallel with this rotation axis.

At this point of time, the first metal layer 51 has been formed on the first face 101 side, but has not been formed on the second face 102 side. Further, the first metal layer 51 has been formed on a portion on the first face 101 side of the inner face of the through hole 150, but has not been formed on a portion on the second face 102 side. Therefore, the first metal layer 51 is deposited by the sputtering technique from the second face 102 side of the glass substrate 100 (FIG. 5). By this process, the surface of the glass substrate 100 is covered with the first metal layer 51. It is desired that the first metal layer 51 is deposited on the first face 101 (and the second face 102) so as to have a thickness of equal to or more than 0.1 μm and equal to or less than 3 μm, and the first metal layer 51 is deposited so as to have a thickness of 1.5 μm. The first metal layer 51 deposited on the inner face of the through hole 150 becomes thinner than the first metal layer 51 deposited on the first face 101.

Subsequently, a second metal layer 52 is grown by an electroplating process using the first metal layer 51 as a seed layer. A mask made of an insulator such as a resist is formed in a region where the second metal layer 52 is not to be grown, prior to the electroplating process. The mask is removed after the second metal layer 52 has been grown (FIG. 6). Thereby, since the second metal layer 52 does not grow in the portion where the mask has been formed, the first metal layer 51 is exposed in a region from which the mask is removed.

The second metal layer 52 is made from Cu. It is to be noted that the second metal layer 52 may be made from a metal containing Au, Ag, Pt, Al, Ni, Cr, Sn, or the like. In this example, the second metal layer 52 is formed so as to have a film thickness which does not fill the inside of the through hole 150. A space within the through hole 150 formed by the inside being not filled may contain gas, may be filled with an insulator such as a resin, or may be filled with a conductor such as another metal. It is to be noted that the second metal layer 52 may also be formed so as to have a film thickness which fills the inside of the through hole 150.

Subsequently, the first metal layer 51 exposed is etched using the second metal layer 52 as a mask, and then the through electrode 50 is formed (FIG. 7). It is to be noted that the through electrode 50 has a stacked structure composed of the first metal layer 51 and the second metal layer 52, but this stacked structure is collectively illustrated in each figure without being distinguished to respective layers.

As the aspect ratio of the through hole 150 increases, the first metal layer 51 may not be formed on a portion of the inner face of the through hole 150. When a region where the first metal layer 51 is not formed is present, a region where the second metal layer 52 is not formed occurs in an electroplating process at the next step. As a result, a failure to achieve electrical continuity between the first face 101 side and the second face 102 side occurs.

On the other hand, when the shape of the through hole 150 satisfies the first conditions and the second conditions described above, the first metal layer is formed approximately over the entire inner face of the through hole 150. Thereby, since the second metal layer 52 becomes hard to separate inside the through hole 150, the through electrode 50 achieving electrical continuity between the first face 101 side and the second face 102 side can be formed.

Figure 8:
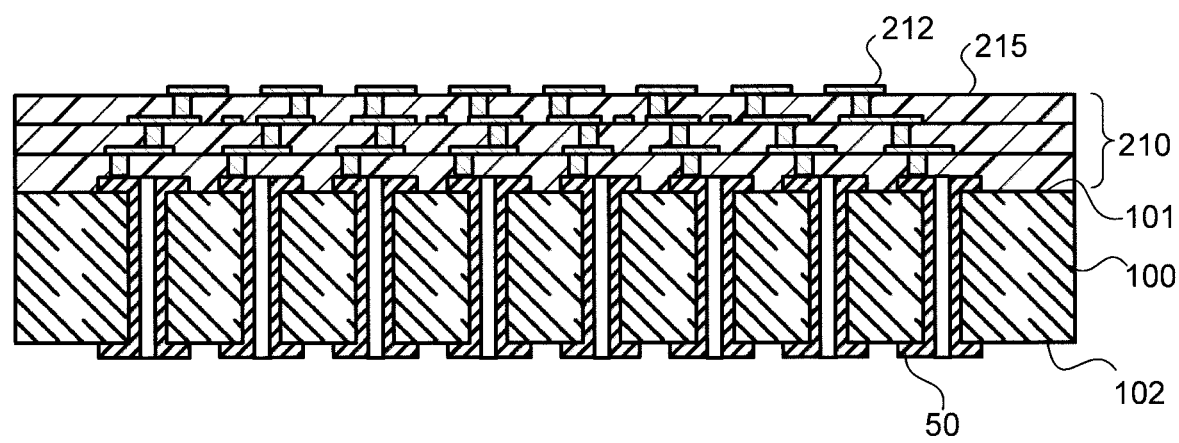
FIG. 8 is a view illustrating a manufacturing method for a through electrode substrate following FIG. 7 (formation of a wiring layer).

FIG. 8 is a view illustrating a manufacturing method for the through electrode substrate following FIG. 7 (formation of a wiring layer). Once the through electrode 50 is formed in the glass substrate 100, a wiring layer 210 is then formed on the first face 101 side of the glass substrate 100. The wiring layer 210 is obtained, for example, by forming an insulation layer 215 having a contact hole and forming a conduction layer 212. The insulation layer 215 is formed, for example, from a photosensitive dry film resist. The contact hole is formed by forming a dry film resist on the glass substrate 100, exposing the same in a predetermined pattern, and developing the same. The conduction layer 212 may be formed by using an electroplating process or may be formed by vapor deposition using a sputtering technique or the like, in the same manner as the through electrode 50 described above. By forming the insulation layer 215 and the conduction layer 212 repeatedly, the wiring layer 210 having a multilayer structure is formed.

Subsequently, a wiring layer 220 is formed on the second face 102 side of the glass substrate 100, and thereby a structure shown in FIG. 1 is obtained. The manufacturing method for the through electrode substrate 10 is as described above.

EXAMPLE

Shape of Through Hole (Without Minimum Value of Diameter Sd)

The shape of the through hole 150 and a manufacturing method for achieving this shape are described. First of all, a shape having the diameter Sd not having a minimum value inside the through hole 150 is described. Here, First Example (shape A) and Second Example (shape B) are described.

Figure 9:
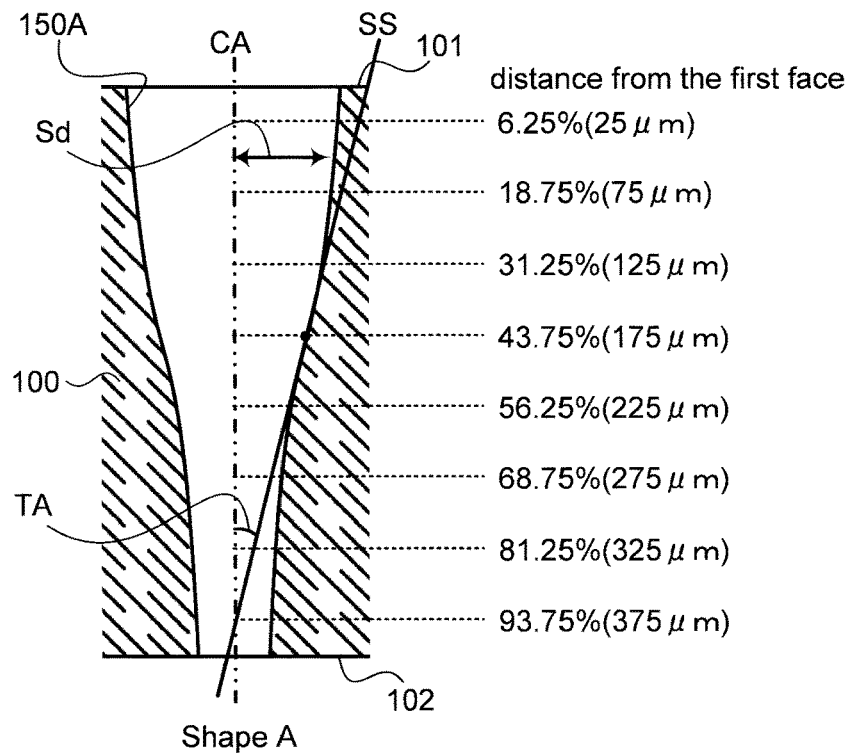
FIG. 9 is a view illustrating a shape example of the through hole (shape A) in First Example of the present disclosure.

FIG. 9 is a view illustrating a shape example (shape A) of a through hole in First Example of the present disclosure. The diameter Sd of a through hole 150A shown in FIG. 9 is the largest size on the first face 101 side, becomes smaller toward the second face 102 side, and is the smallest size on the second face 102 side. It is to be noted that, in FIG. 9, a center axis CA of the through hole 150A corresponds to a center of a circle appearing when the through hole 150A is cut along a plane parallel to the first face 101. Therefore, a distance from the center axis CA to the inner face of the through hole 150A (a radius of the circle) corresponds to the diameter Sd. Further, an inclination angle TA is an angle of the inner face to the center axis CA. In FIG. 9, an angle between an inclination SS of the inner face at 175 μm (43.75%) from the first face 101 and the center axis CA is exemplified as the inclination angle TA.

Figure 10:
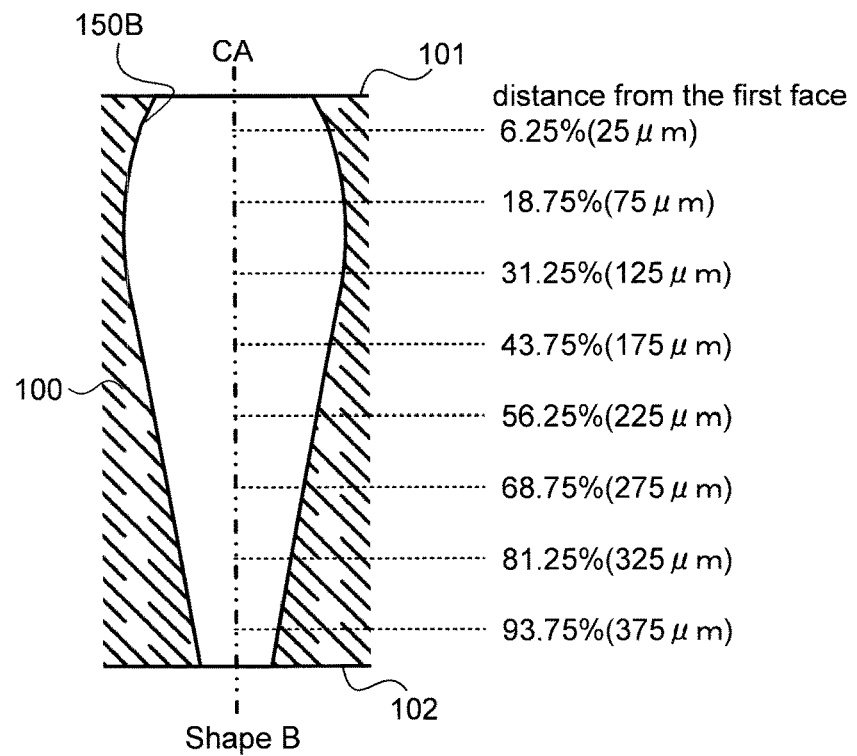
FIG. 10 is a view illustrating a shape example of the through hole (shape B) in Second Example of the present disclosure.

FIG. 10 is a view illustrating the shape example (shape B) of a through hole in Second Example of the present disclosure. The diameter Sd of a through hole 150B shown in FIG. 10 is smaller on the first face 101 side than on the second face 102 side, and becomes larger once from the first face 101 side toward the second face 102 side and then becomes smaller. That is, the diameter Sd has a maximum value inside the through hole. A position where the diameter Sd reaches the maximum value is present on a side nearer to the first face 101 side of a middle position between the first face 101 and the second face 102.

The through holes having the shape A and the shape B were produced by an apparatus for performing laser irradiation disclosed in the above-described PTL 1 (International Publication WO 2010/087483). In irradiation with an excimer laser light, irradiation fluence at a face to be processed of the glass substrate 100 was adjusted for each 50 μm. By adjusting the irradiation fluence in this manner, the shape of the through hole to be formed was controlled.

First Example and First Comparative Example

Regarding various shapes of the through hole 150A assuming the shape A, influence on forming the first metal layer 51 was evaluated. Here, through holes having shapes A1 to A3 were formed as First Example. Further, through holes having shapes A4, A5 were formed as First Comparative Example. A relationship between a depth Fd and the irradiation fluence (the number of shots) in each shape is as shown in the following Table 1. It is to be noted that the depth Fd corresponds to a distance from the first face 101. Therefore, the depth Fd=0 μm corresponds to the first face 101, and the depth Fd=400 μm corresponds to the second face 102.

TABLE 1

| Depth Fd | Irradiation Condition of Laser Light (shape A) |||||
|---|---|---|---|---|---|
| | Irradiation Fluence (J/cm2), The number of Shots (times) |||||
| (μm) | A1 | A2 | A3 | A4 | A5 |
| 0-50 | 9.3, 537 | 8.6, 583 | 8.9, 559 | 8.9, 559 | 8.6, 583 |
| 50-100 | 10.0, 499 | 10.7, 465 | 8.9, 559 | 8.9, 559 | 8.6, 583 |
| 100-150 | 11.5, 436 | 9.3, 537 | 8.6, 583 | 8.6, 583 | 8.6, 583 |
| 150-200 | 12.9, 388 | 9.3, 537 | 8.6, 583 | 8.2, 608 | 8.6, 583 |
| 200-250 | 10.0, 499 | 8.6, 583 | 8.6, 583 | 8.2, 608 | 7.9, 636 |
| 250-300 | 9.3, 537 | 7.9, 636 | 8.6, 583 | 8.2, 608 | 8.2, 608 |
| 300-350 | 8.6, 583 | 7.9, 636 | 8.2, 608 | 8.2, 608 | 8.2, 608 |
| 350-400 | 9.3, 537 | 7.9, 636 | 8.2, 608 | 7.9, 636 | 7.9, 636 |

Figure 11:
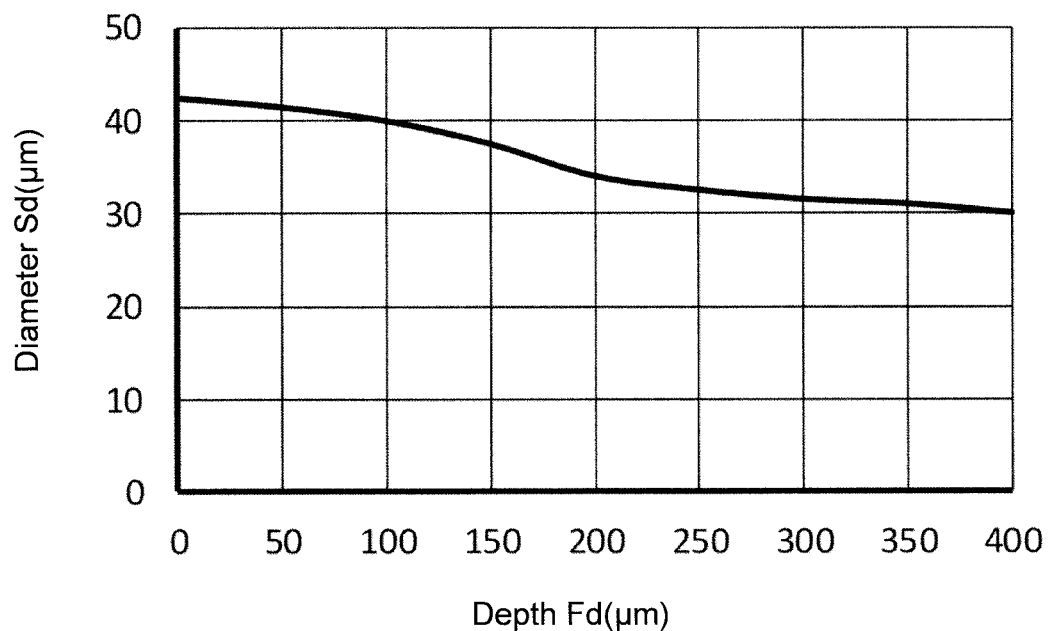
FIG. 11 is graphs illustrating shape properties of the through hole in First Example (shape A1) of the present disclosure.
Figure 11:
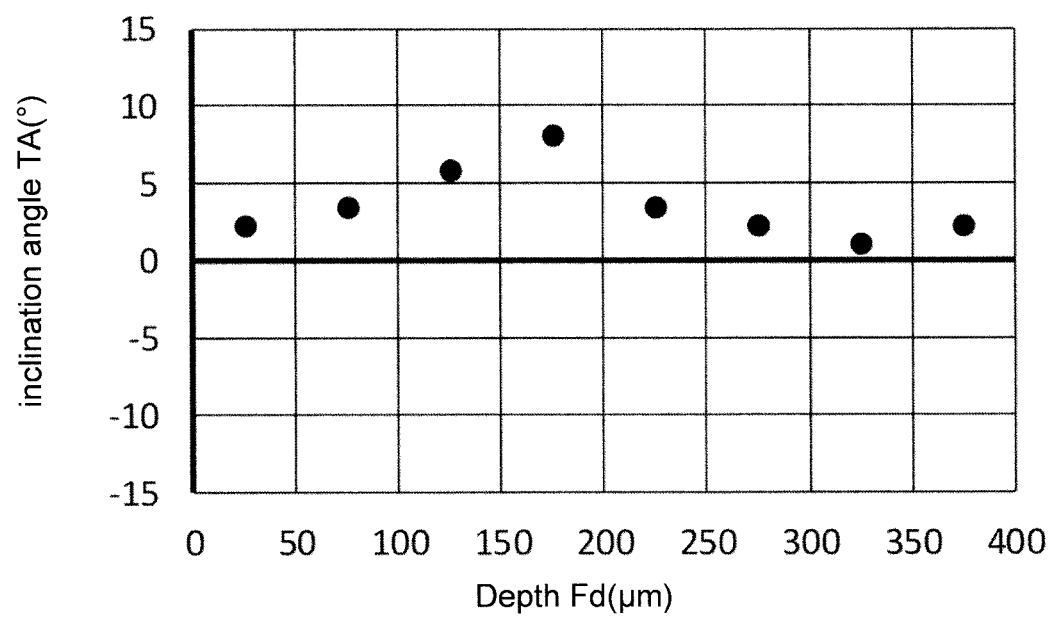
Figure 12:
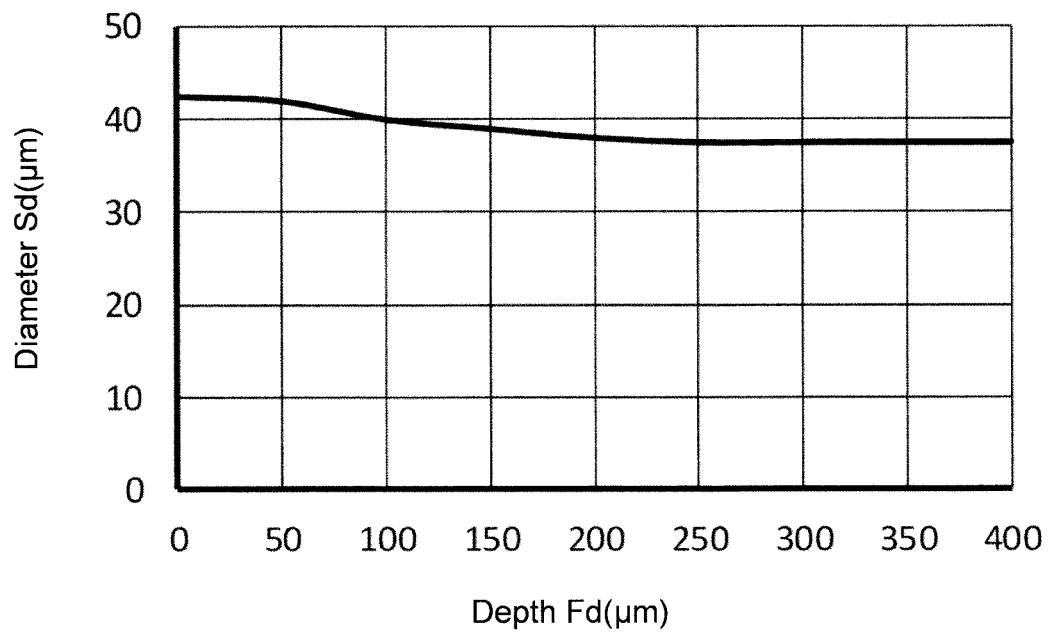
FIG. 12 is graphs illustrating shape properties of the through hole in First Example (shape A2) of the present disclosure.
Figure 12:
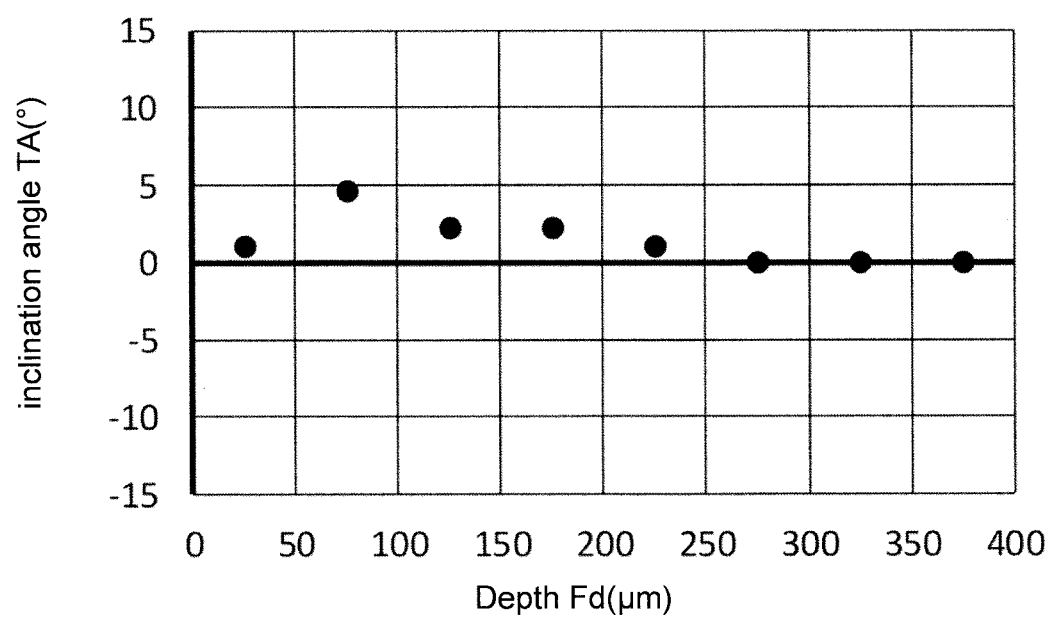
Figure 13:
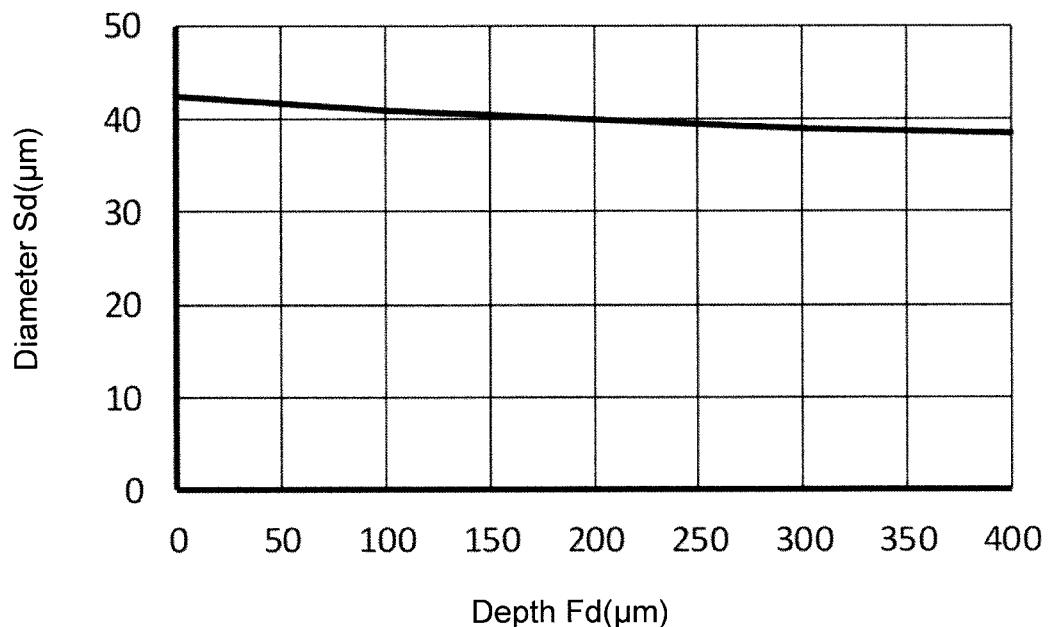
FIG. 13 is graphs illustrating shape properties of the through hole in First Example (shape A3) of the present disclosure.
Figure 13:
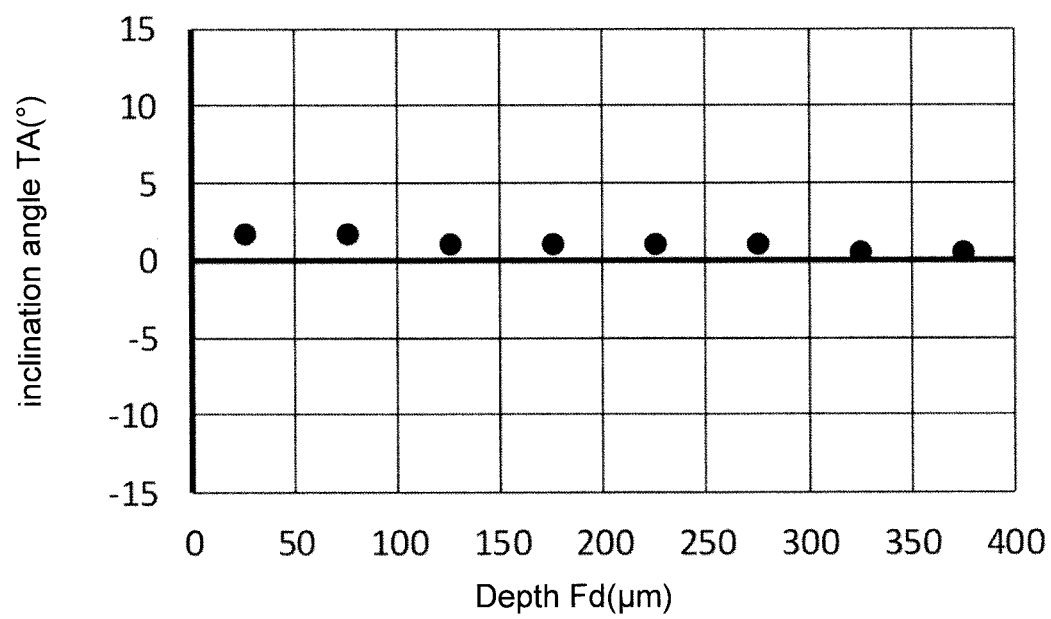
Figure 14:
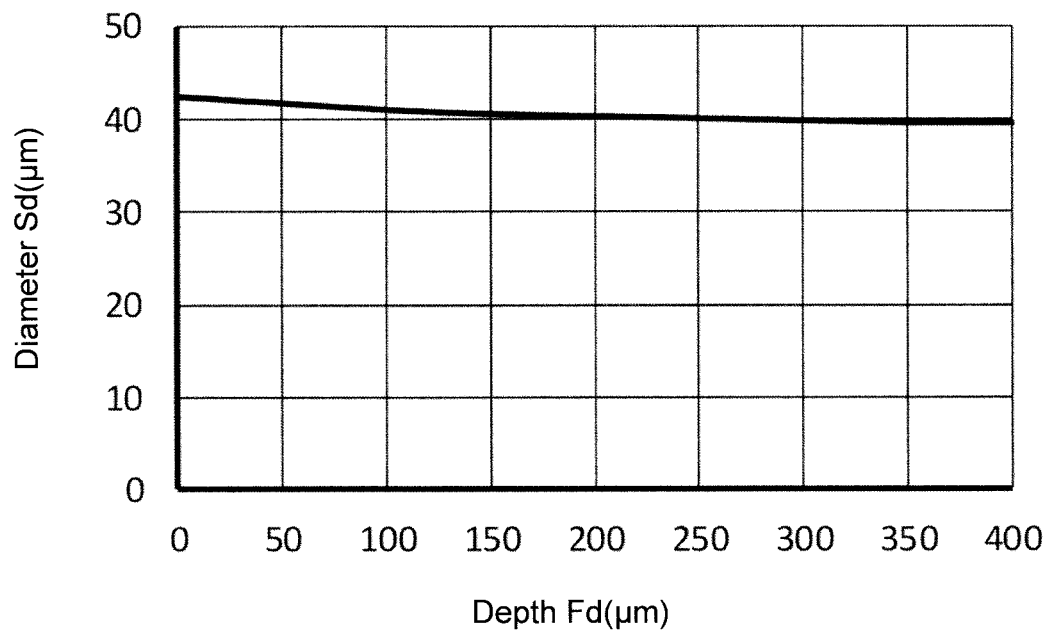
FIG. 14 is graphs illustrating shape properties of the through hole in First Comparative Example (shape A4) of the present disclosure.
Figure 14:
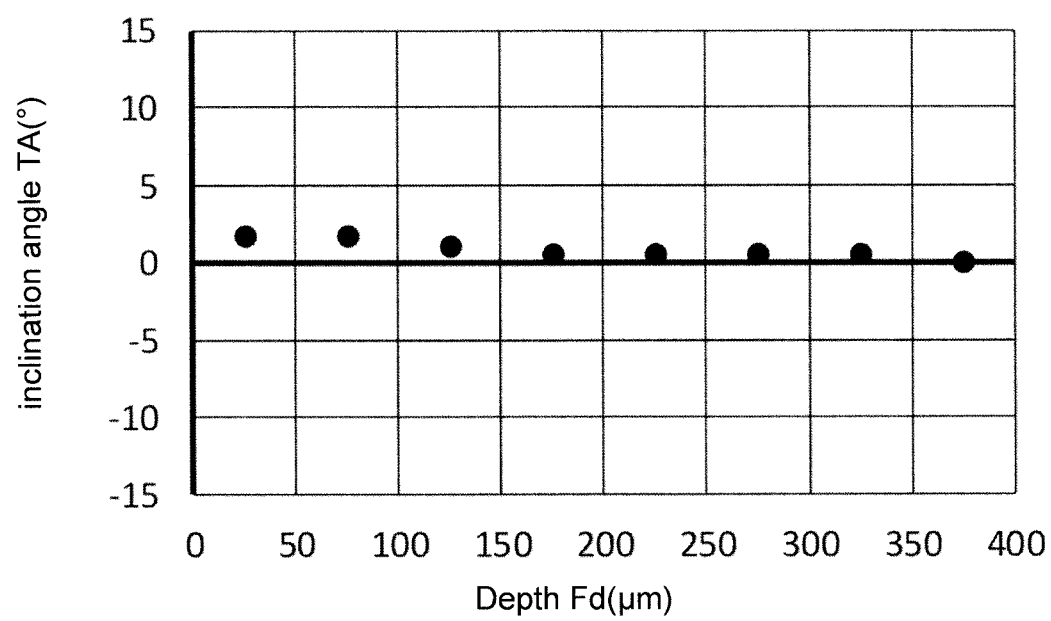
Figure 15:
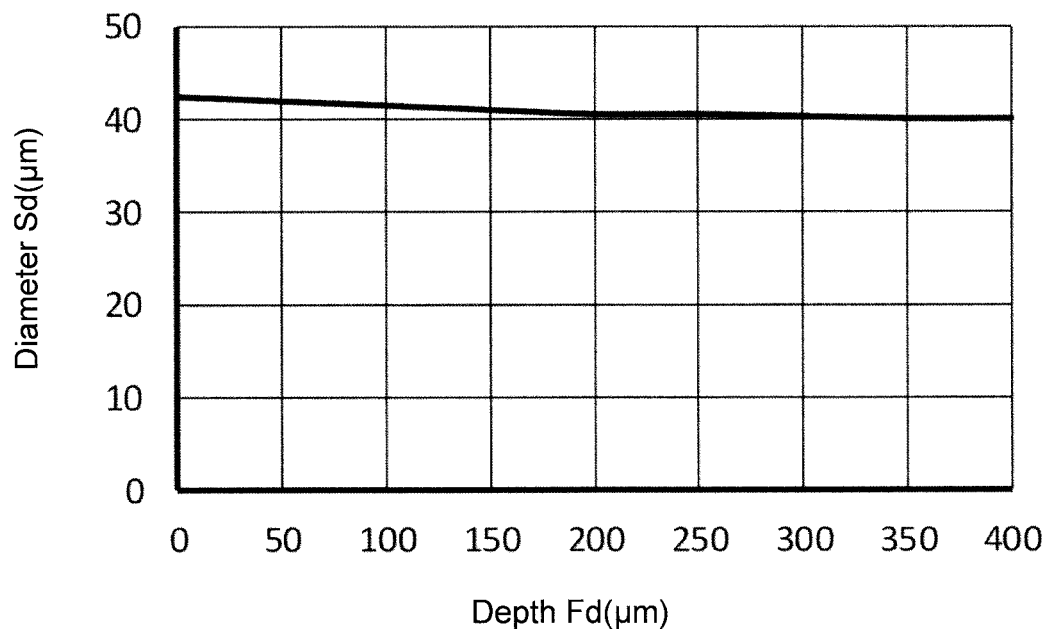
FIG. 15 is graphs illustrating shape properties of the through hole in First Comparative Example (shape A5) of the present disclosure.
Figure 15:
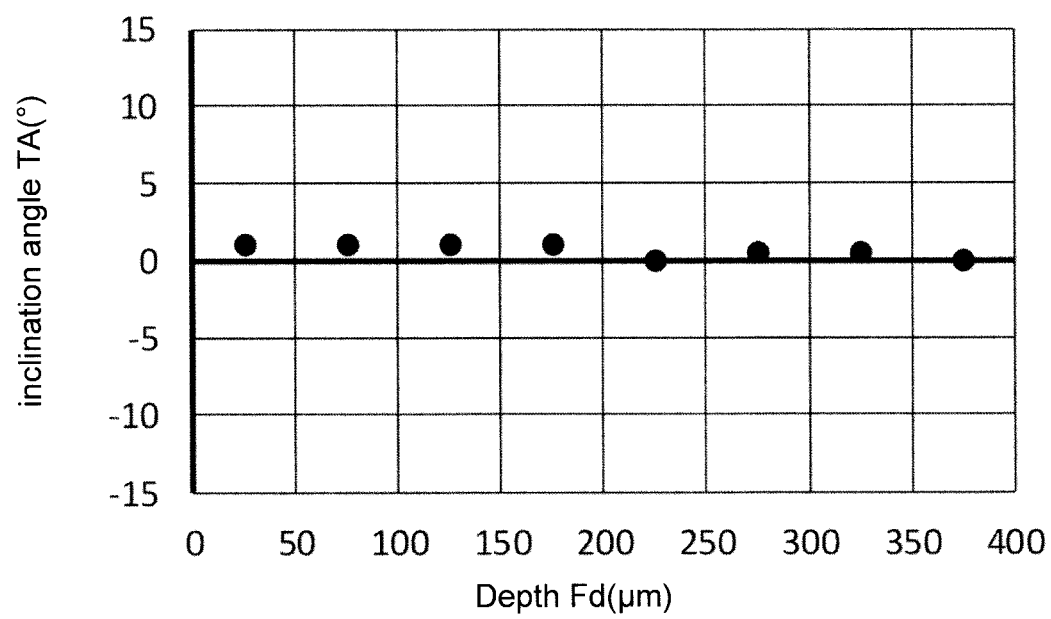

FIG. 11 is graphs illustrating shape properties of the through hole in First Example (shape A1) of the present disclosure. FIG. 12 is graphs illustrating shape properties of the through hole in First Example (shape A2) of the present disclosure. FIG. 13 is graphs illustrating shape properties of the through hole in First Example (shape A3) of the present disclosure. FIG. 14 is a view illustrating shape properties of the through hole in First Comparative Example (shape A4) of the present disclosure. FIG. 15 is a view illustrating shape properties of the through hole in First Comparative Example (shape A5) of the present disclosure. The shape properties of the through holes shown in FIG. 11 to FIG. 15 include a relationship between the depth Fd and the diameter Sd and a relationship between the depth Fd and the inclination angle TA. It is to be noted that measurement positions of the inclination angles TA are positions at distances of 6.25% (25 μm), 18.75% (75 μm), 31.25% (125 μm), 43.75% (175 μm), 56.25% (225 μm), 68.75% (275 μm), 81.25% (325 μm), and 93.75% (375 μm) from the first face 101 in a section from the first face 101 to the second face 102 (eight points in total).

In the through holes 150A having the shapes A1 to A5, the through electrodes 50 were formed by the method described in the above-described first embodiment. A cross-section of the through electrode 50 having each shape was observed, and whether or not the first metal layer 51 was formed over the entire inner face of the through hole 150A was evaluated. It was judged to be good (OK) if a region where the first metal layer 51 was not formed was absent, while it was judged to be not good (NG) if a region where the first metal layer 51 was not formed was present. It is to be noted that, since the first metal layer was very thin, whether or not the first metal layer 51 was formed was evaluated indirectly by forming the second metal layer 52 by the electroplating process and observing a situation of the second metal layer 52.

As a result, it was judged that the shapes A1, A2, A3 were good, while the shapes A4, A5 were not good.

Second Example and Second Comparative Example

Regarding various shapes of the through hole 150B assuming the shape B, influence on forming the first metal layer 51 was evaluated. Here, through holes having shapes B1, B2 were formed as Second Example. Further, through holes having shapes B3, B4 were formed as Second Comparative Example. A relationship between the depth Fd and the irradiation fluence (the number of shots) in each shape is as shown in the following Table 2.

TABLE 2

| Irradiation Condition of Laser Light (shape B) | | | | |
|---|---|---|---|---|
| Depth Fd | Irradiation Fluence (J/cm2), The number of Shots (times) | | | |
| (µm) | B1 | B2 | B3 | B4 |
| 0-50 | 3.5, 1414 | 4.3, 1176 | 2.1, 2363 | 2.8, 1771 |
| 50-100 | 2.8, 1771 | 4.3, 1176 | 3.5, 1414 | 2.1, 2363 |
| 100-150 | 9.3, 537 | 9.3, 537 | 9.3, 537 | 6.4, 780 |
| 150-200 | 10.0, 499 | 10.0, 499 | 10.0, 499 | 10.0, 499 |
| 200-250 | 11.5, 436 | 10.7, 465 | 10.7, 465 | 10.7, 465 |
| 250-300 | 11.5, 436 | 10.0, 499 | 10.0, 499 | 10.0, 499 |
| 300-350 | 11.5, 436 | 10.0, 499 | 10.0, 499 | 10.0, 499 |
| 350-400 | 11.5, 436 | 9.3, 537 | 7.1, 701 | 9.3, 537 |

Figure 16:
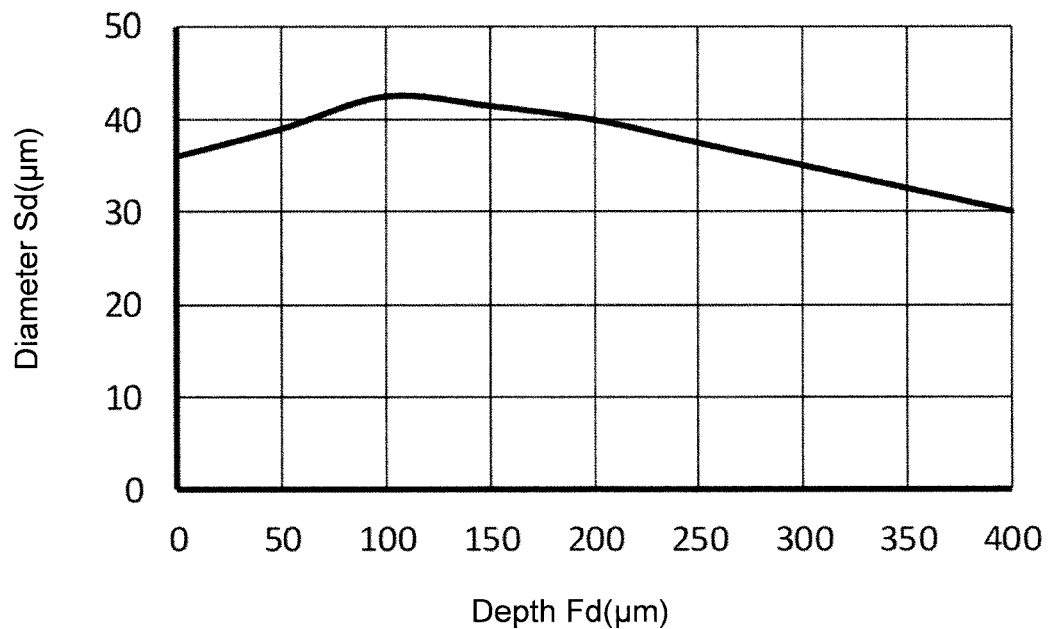
FIG. 16 is graphs illustrating shape properties of the through hole in Second Example (shape B1) of the present disclosure.
Figure 16:
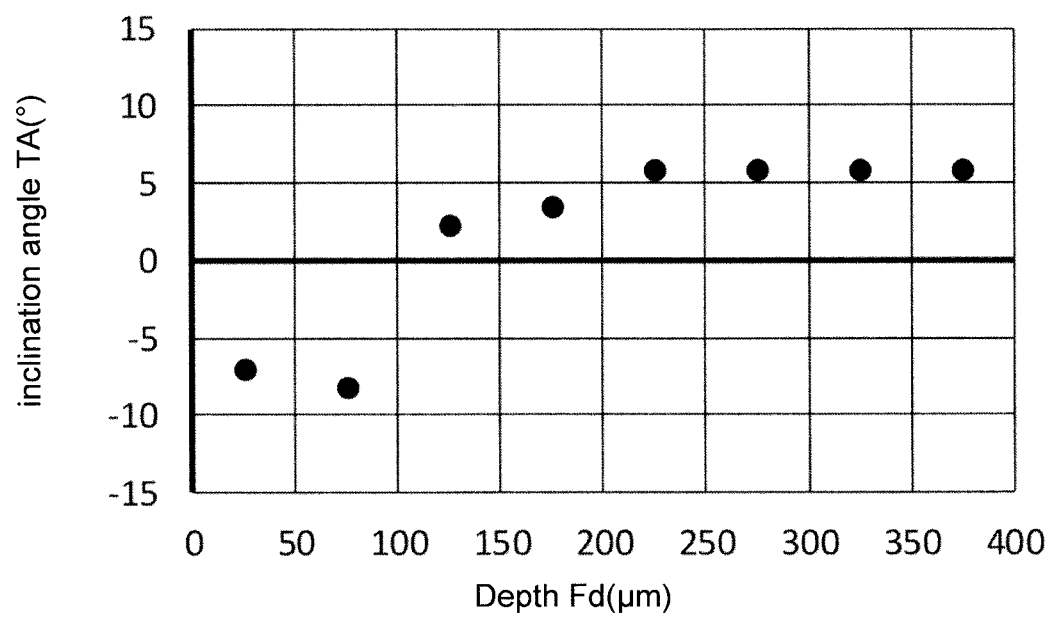
Figure 17:
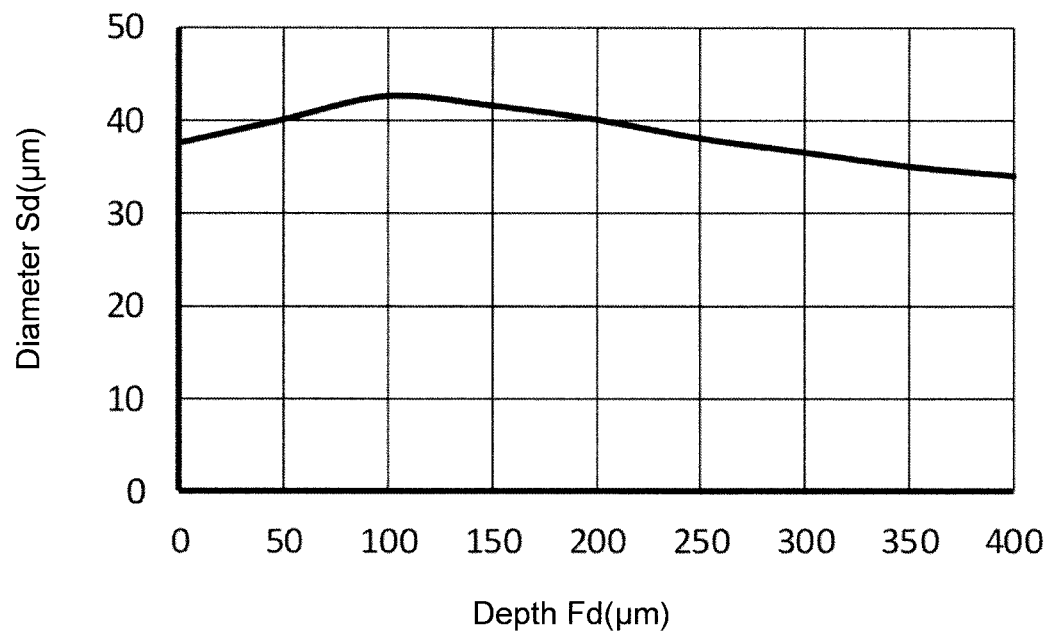
FIG. 17 is graphs illustrating shape properties of the through hole in Second Example (shape B2) of the present disclosure.
Figure 17:
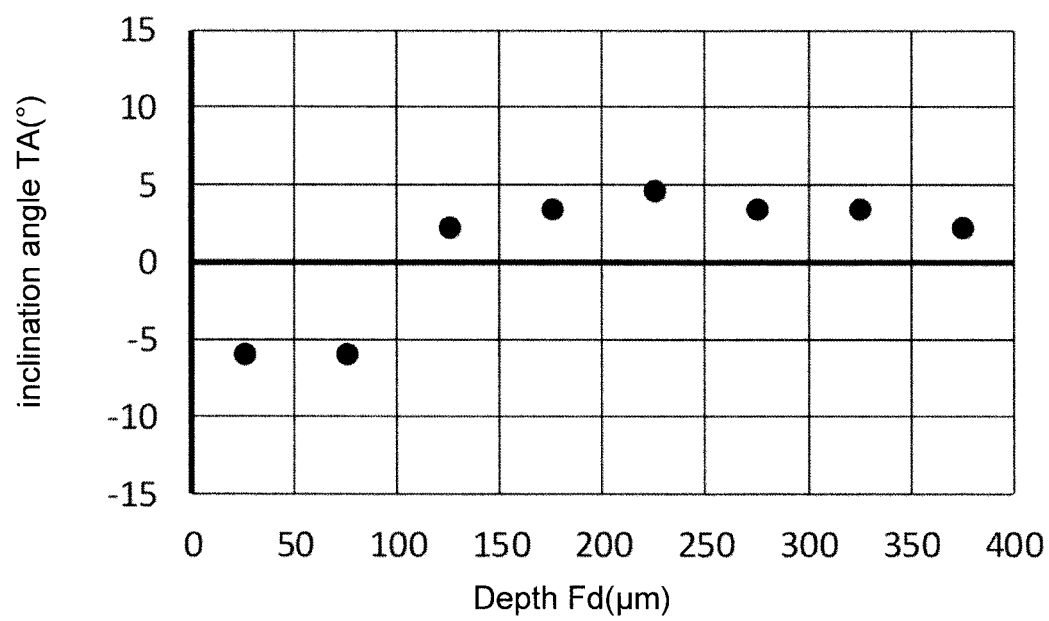
Figure 18:
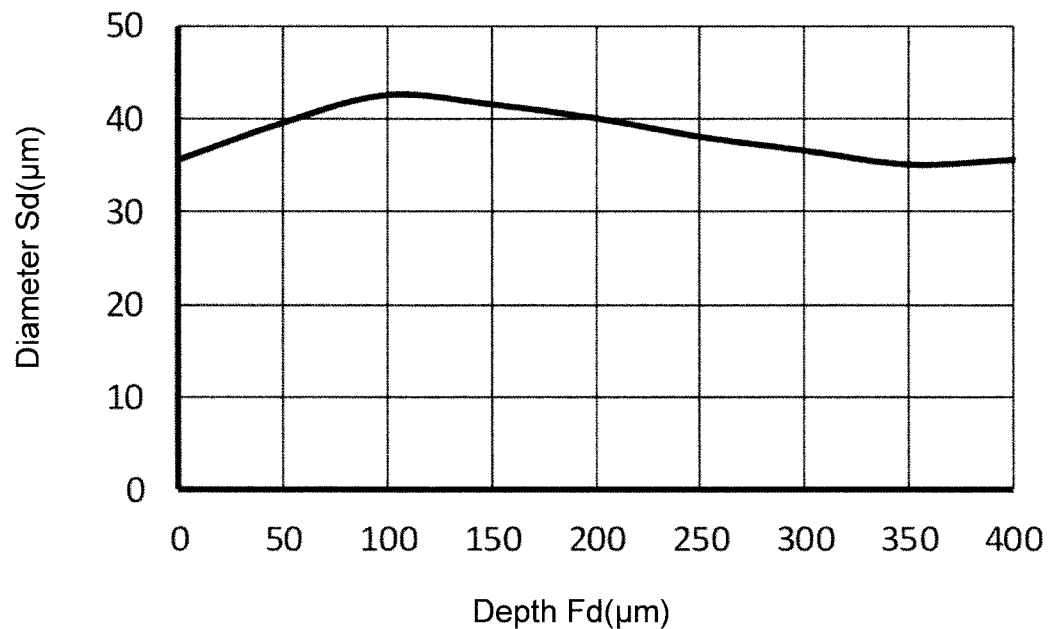
FIG. 18 is a view illustrating shape properties of the through hole in Second Comparative Example (shape B3) of the present disclosure.
Figure 18:
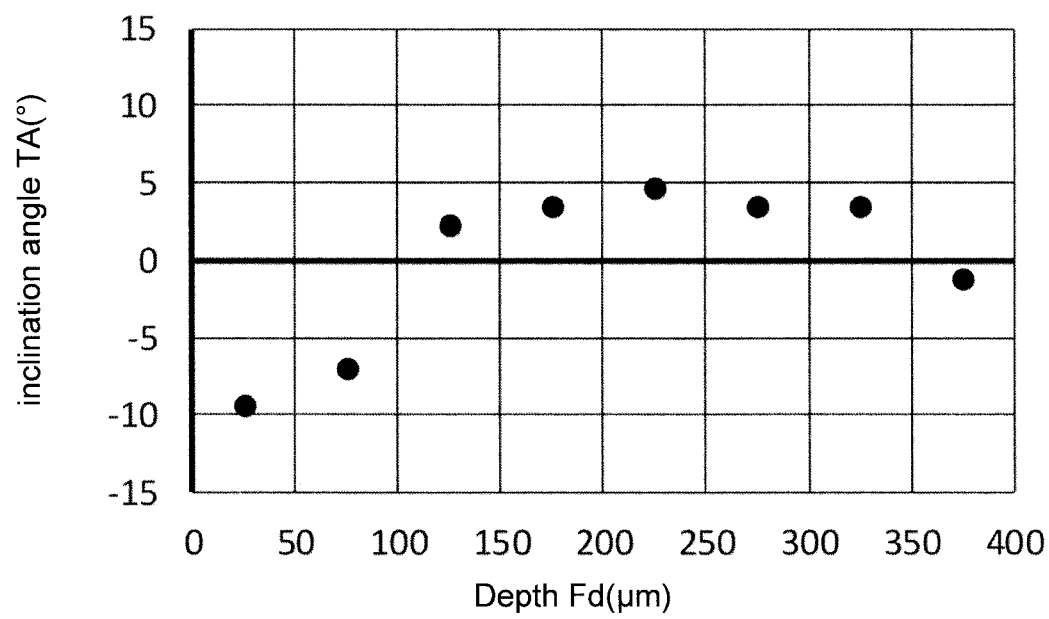
Figure 19:
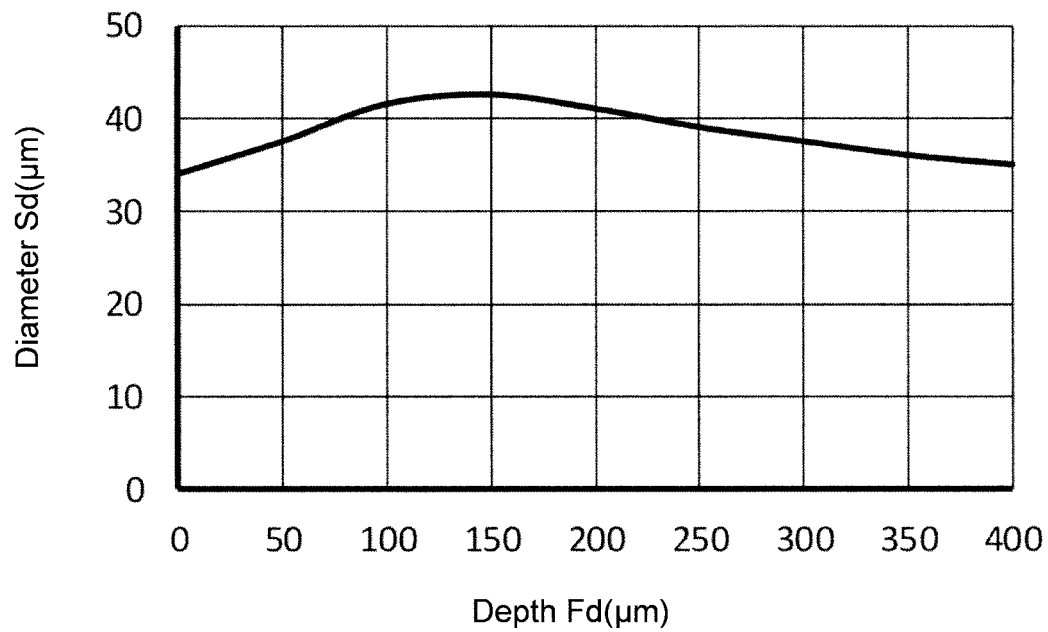
FIG. 19 is graphs illustrating shape properties of the through hole in Second Comparative Example (shape B4) of the present disclosure.
Figure 19:
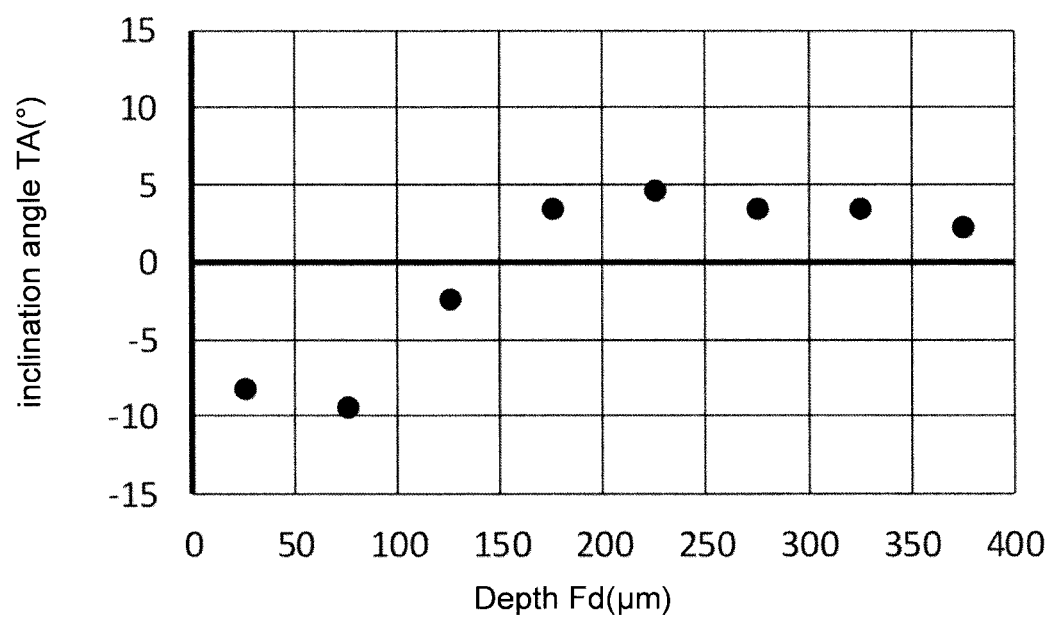

FIG. 16 is graphs illustrating shape properties of the through hole in Second Example (shape B1) of the present disclosure. FIG. 17 is graphs illustrating shape properties of the through hole in Second Example (shape B2) of the present disclosure. FIG. 18 is graphs illustrating shape properties of the through hole in Second Comparative Example (shape B3) of the present disclosure, FIG. 19 is graphs illustrating shape properties of the through hole in Second Comparative Example (shape B4) of the present disclosure. The shape properties of the through hole shown in FIG. 16 to FIG. 19 include a relationship between the depth Fd and the diameter Sd and a relationship between the depth Fd and the inclination angle TA. In the evaluation method, whether or not the first metal layer 51 was formed over the entire inner face of the through hole 150B was evaluated in the same manner as described above.

As a result, it was judged that the shapes B1, B2 were good, while the shapes B3, B4 were not good.

Relationship Between Evaluation Result and Inclination Angle (Without Minimum Value of Diameter Sd)

From the evaluation results obtained from First Example, First Comparative Example, Second Example, and Second Comparative Example described above, it was found that when a total value TSA of the inclination angle TA satisfied a predetermined condition, a good evaluation result could be obtained. The inclination angle total value TSA is a value obtained by summing the inclination angles TA at the eight points. A relationship between the inclination angle total value TSA and the evaluation result with respect to each shape is shown in the following Table 3.

TABLE 3

| Inclination Angle Total Value TSA and Evaluation Result with respect to Each Shape | | |
|---|---|---|
| Shape | Inclination Angle Total Value TSA (°) | Evaluation Result |
| A1 | 29.23 | Good |
| A2 | 11.71 | Good |
| A3 | 9.38 | Good |
| A4 | 7.03 | Not Good |
| A5 | 5.86 | Not Good |
| B1 | 14.07 | Good |
| B2 | 8.22 | Good |
| B3 | 0.09 | Not Good |
| B4 | −2.24 | Not Good |

As shown in Table 3, when the inclination angle total value TSA at the eight measurement points is 8° or more, the evaluation result is good. This shows that the above-described through hole 150 has a shape satisfying the "first conditions".

Shape of Through Hole (With Minimum Value of Diameter Sd)

A shape in which the diameter Sd has a minimum value inside the through hole 150 is described. Here, Third Example (shape C), Fourth Example (shape D), and Fifth Example (shape E) are described.

Figure 20:
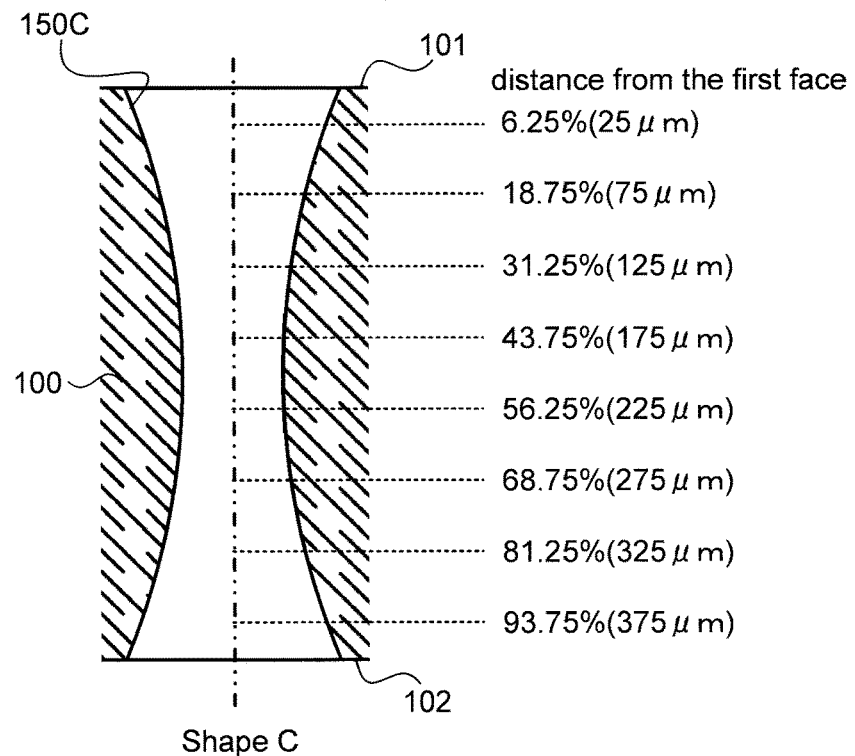
FIG. 20 is a view illustrating a shape example (shape C) of the through hole in Third Example of the present disclosure.

FIG. 20 is a view illustrating a shape example (shape C) of a through hole in Third Example of the present disclosure. The diameter Sd of a through hole 150C shown in FIG. 20 is the largest on the first face 101 side and the second face 102 side, and has a minimum value in the vicinity of a middle inside the through hole. The vicinity of the middle is a position of the depth Fd between 43.75% (175 µm) and 56.25% (225 µm), and is a position of about 50% (200 µm).

Figure 21:
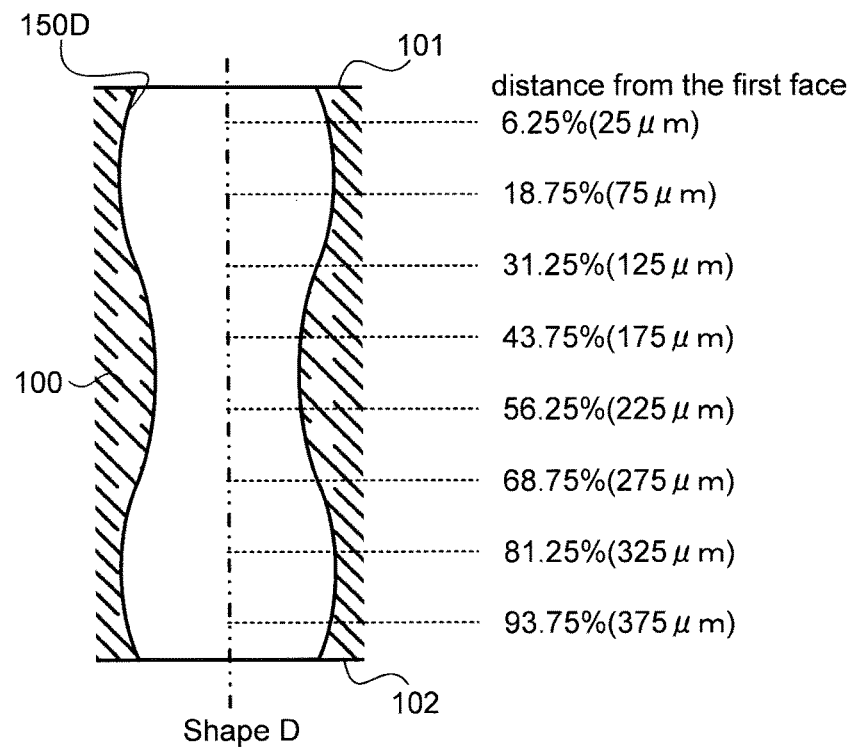
FIG. 21 is a view illustrating a shape example (shape D) of the through hole in Fourth Example of the present disclosure.

FIG. 21 is a view illustrating a shape example (shape D) of a through hole in Fourth Example of the present disclosure. The diameter Sd of a through hole 150D shown in FIG. 21 has a minimum value in the vicinity of the middle inside the through hole, and has a maximum value at an intermediate position between the first face 101 and the vicinity of the middle and at an intermediate position between the second face 102 and the vicinity of the middle.

Figure 22:
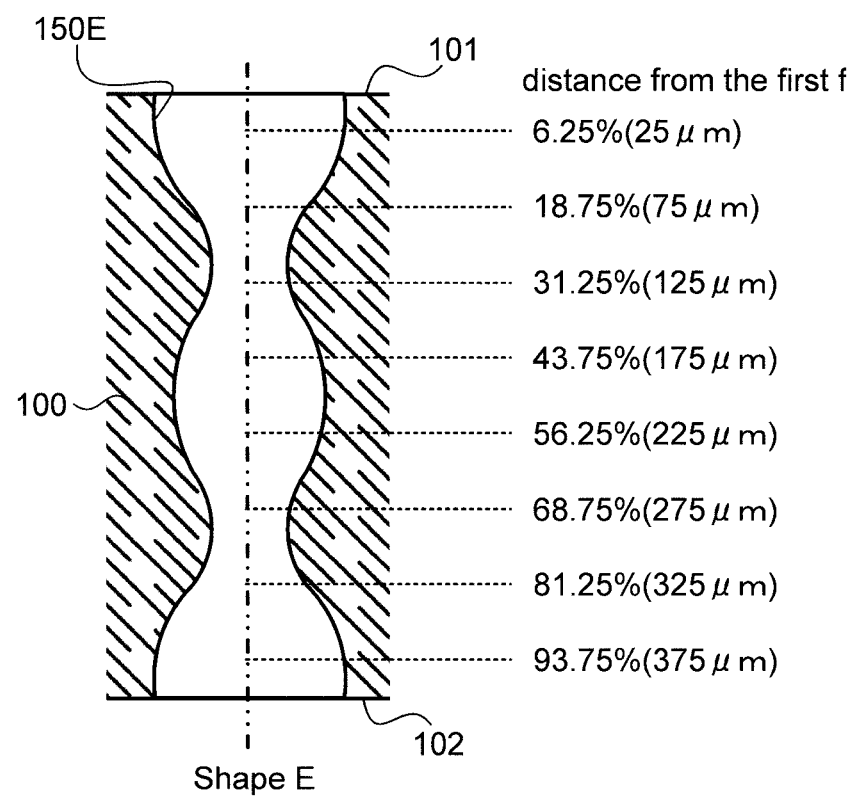
FIG. 22 is a view illustrating a shape example (shape E) of the through hole in Fifth Example of the present disclosure.

FIG. 22 is a view illustrating a shape example (shape E) of a through hole in Fifth Example of the present disclosure. The diameter Sd of a through hole 150E shown in FIG. 22 has a maximum value on the first face 101 side and the second face 102 side, and has a minimum value at an intermediate position between the first face 101 and the vicinity of the middle and at an intermediate position between the second face 102 and the vicinity of the middle. It is to be noted that the diameter Sd has the maximum value in the vicinity of the middle, except for the diameter Sd at the first face 101 and the diameter Sd at the second face 102.

The through holes having the shape C, the shape D and the shape E were produced by using an apparatus for performing laser irradiation and an etching apparatus disclosed in the above-described PTL 2 (Japanese Patent Application Publication No. 2014-501686). Specifically, a damage region is formed inside the glass substrate 100 by performing irradiation with a UV laser beam using an Nd:KGW laser apparatus described in the above-described literature. At this time, laser beam irradiation from the first face 101 side of the glass substrate 100 and laser beam irradiation from the &de of the second face 102 thereof were sequentially performed. Laser beam irradiation from each face was performed under the same conditions.

After laser beam irradiation from each of the faces was finished, the damage region of the glass substrate 100 was dissolved by performing an etching process for 10 minutes within an ultrasonic bath using an etching solution (aqueous solution of HF (20 volume %)+HNO3 (10 volume %)) at 35° C.

The shape of the damage region to be formed on the glass substrate 100 was adjusted by adjusting an irradiation condition of the laser beam in the above-described process. When the shape of the damage region varies, the shape of the through hole also varies with the variation in the shape of the damage region. The irradiation condition includes an inlet aperture diameter of the laser beam (an aperture diameter of a surface of the glass substrate 100), an intermediate aperture diameter (an aperture diameter in the vicinity of the middle of the glass substrate 100 (200 μm from the surface), and an irradiation time. The inlet aperture diameter and the intermediate aperture diameter are adjusted by changing a lens NA and a focal position.

Third Example and Third Comparative Example

Regarding various shapes of the through hole 150C assuming the shape C, influence on forming the first metal layer 51 was evaluated. Here, through holes having shapes C1, C2, C3 were formed as Third Example. Further, a through hole having shape C4 was formed as Third Comparative Example. The irradiation condition in each shape is as shown in the following Table 4.

TABLE 4

| Irradiation Condition of Laser Light (Shape C) | | | | |
|---|---|---|---|---|
| | C1 | C2 | C3 | C4 |
| Inlet Aperture Diameter (μm) | 75 | 75 | 75 | 75 |
| Intermediate Aperture Diameter (μm) | 55 | 65 | 70 | 73 |
| Irradiation Time (msec.) | 25 | 25 | 25 | 25 |

Figure 23:
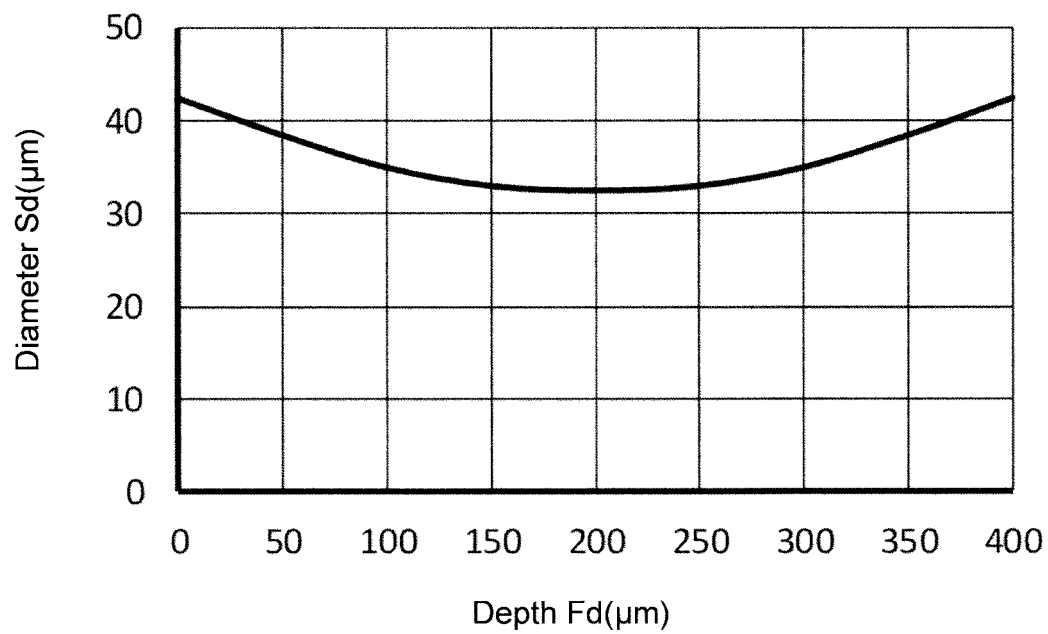
FIG. 23 is graphs illustrating shape properties of the through hole in Third Example (shape C1) of the present disclosure.
Figure 23:
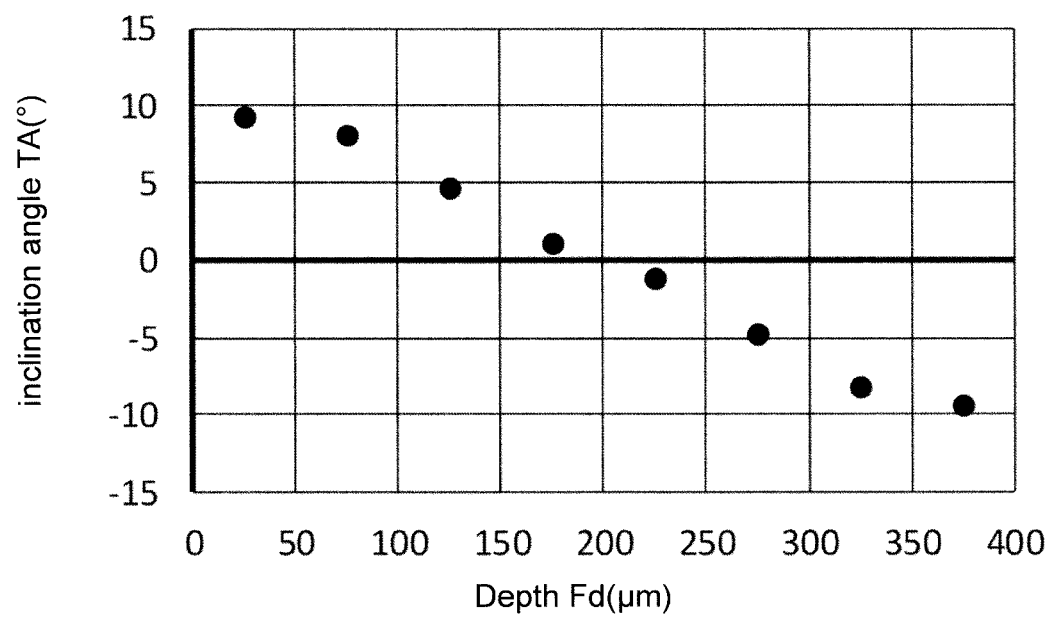
Figure 24:
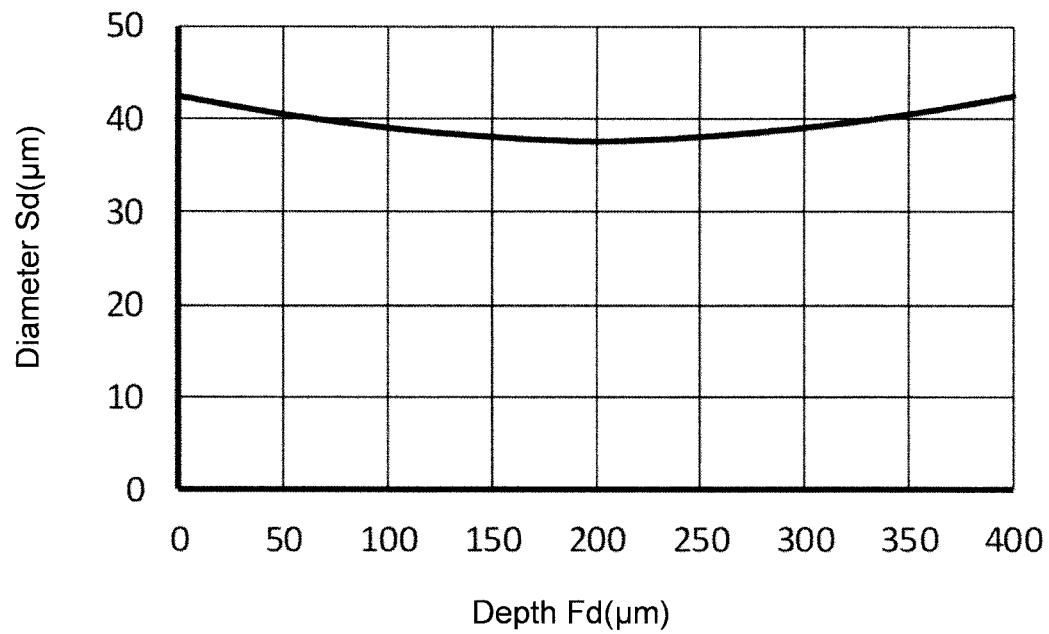
FIG. 24 is graphs illustrating shape properties of the through hole in Third Example (shape C2) of the present disclosure.
Figure 24:
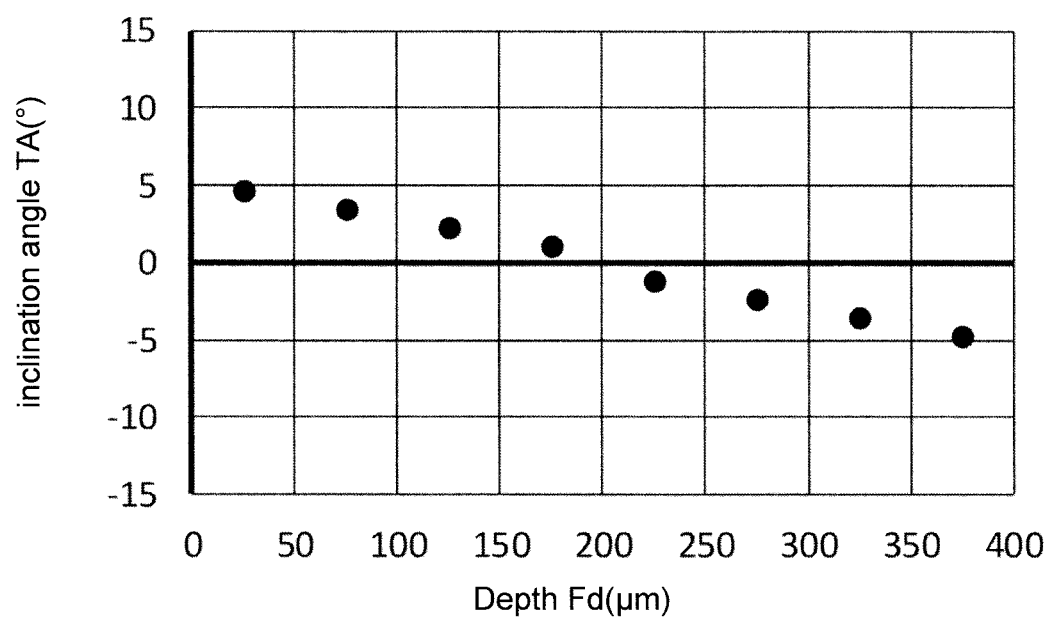
Figure 25:
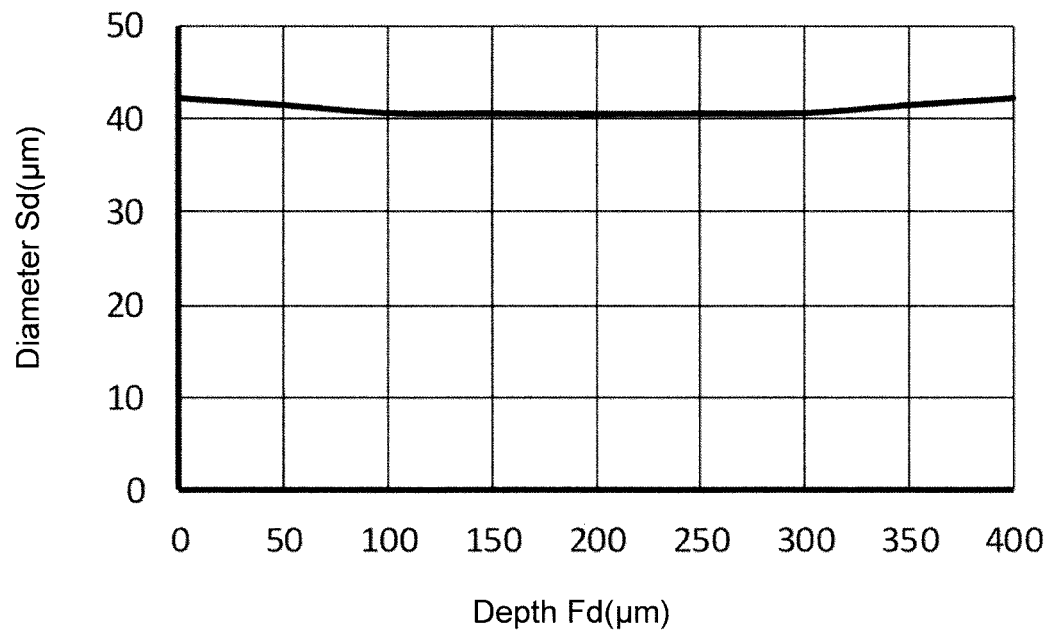
FIG. 25 is graphs illustrating shape properties of the through hole in Third Example (shape C3) of the present disclosure.
Figure 25:
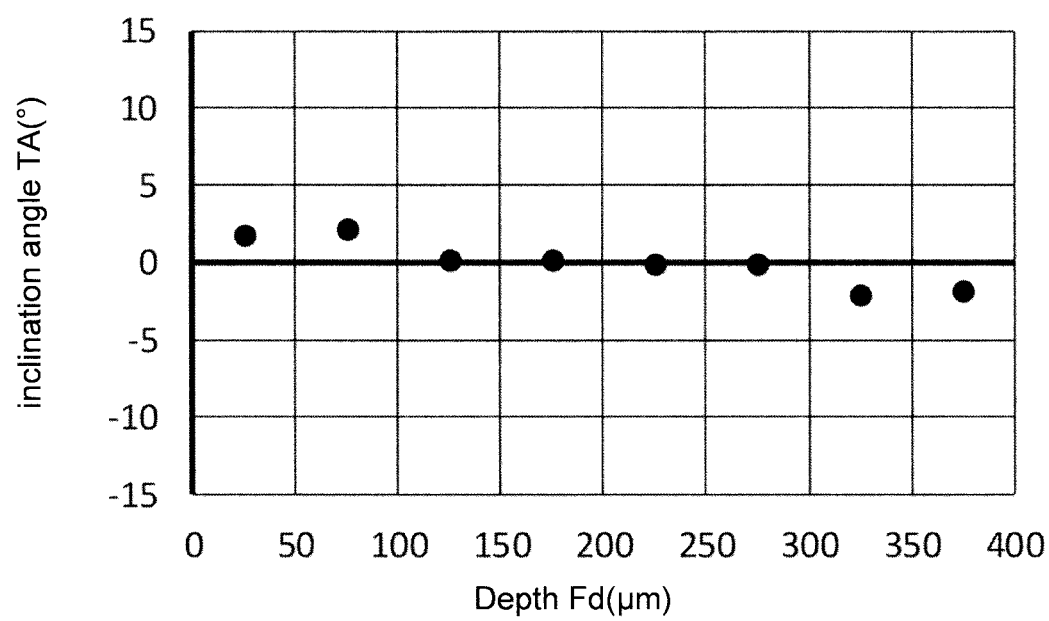
Figure 26:
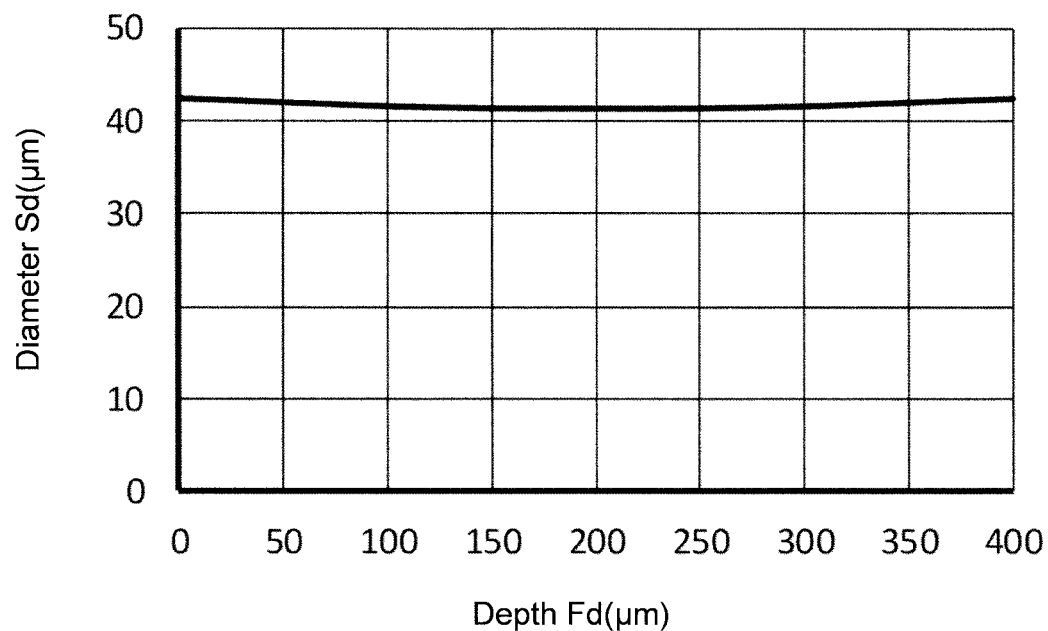
FIG. 26 is graphs illustrating shape properties of the through hole in Third Comparative Example (shape C4) of the present disclosure.
Figure 26:
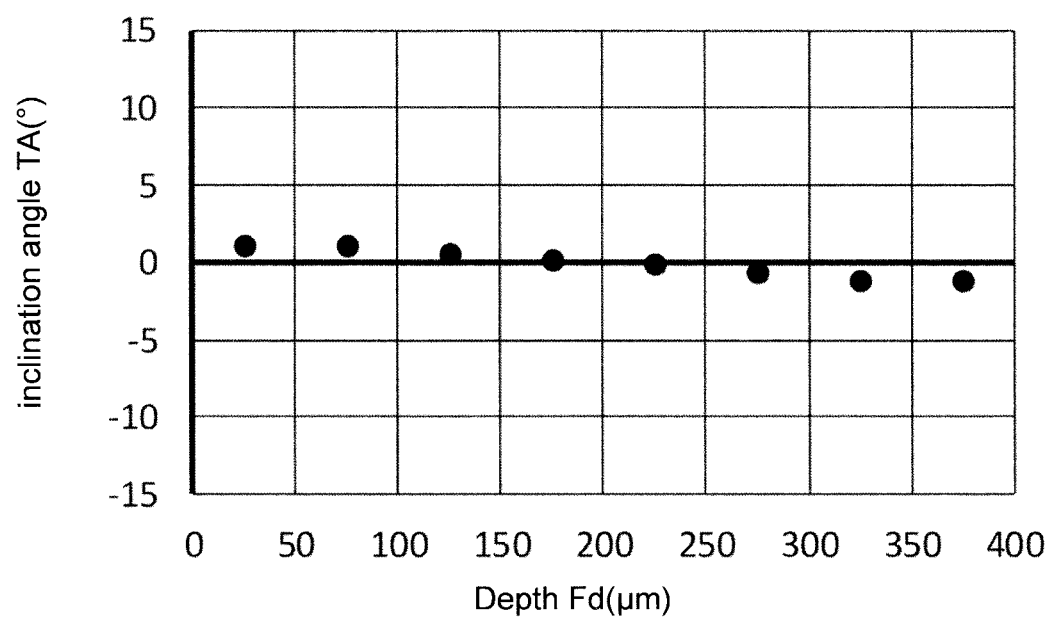

FIG. 23 is graphs illustrating shape properties of a through hole in Third Example (shape C1) of the present disclosure. FIG. 24 is graphs illustrating shape properties of a through hole in Third Example (shape C2) of the present disclosure. FIG. 25 is graphs illustrating shape properties of a through hole in Third Example (shape C3) of the present disclosure. FIG. 26 is graphs illustrating shape properties of a through hole in Third Comparative Example (shape C4) of the present disclosure. The shape properties of the through hole shown in FIG. 23 to FIG. 26 include a relationship between the depth Fd and the diameter Sd and a relationship between the depth Fd and the inclination angle TA. In the evaluation method, whether or not the first metal layer 51 was formed over the entire inner face of the through hole 150C was evaluated in the same manner described above.

As a result, it was judged that the shapes C1, C2, C3 were good while the shape C4 was not good.

Fourth Example and Fourth Comparative Example

Regarding various shapes of the through hole 150D assuming the shape D, influence on forming the first metal layer 51 was evaluated. Here, through holes having shapes D1, D2 were formed as Fourth Example. Further, a through hole having shape D3, D4 were formed as Fourth Comparative Example. The irradiation condition in each shape is as shown in the following Table 5.

TABLE 5

| Irradiation Condition of Laser Light (Shape D) | | | | |
|---|---|---|---|---|
| | D1 | D2 | D3 | D4 |
| Inlet Aperture Diameter (μm) | 58 | 58 | 53 | 50 |
| Intermediate Aperture Diameter (μm) | 80 | 80 | 80 | 100 |
| Irradiation Time (msec.) | 15 | 18 | 20 | 22 |

Figure 27:
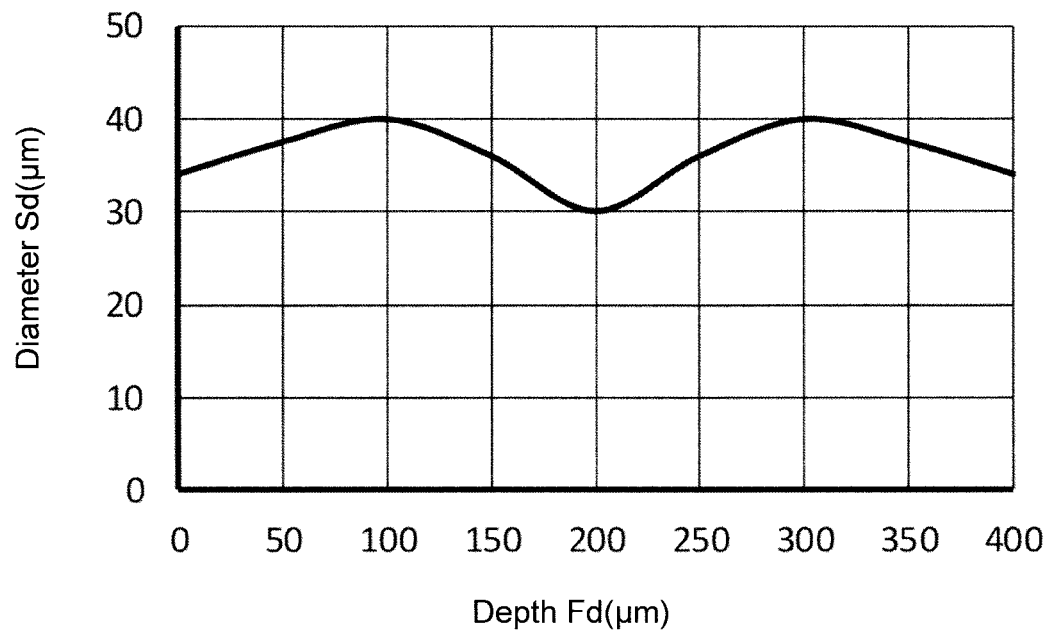
FIG. 27 is graphs illustrating shape properties of the through hole in Fourth Example (shape D1) of the present disclosure.
Figure 27:
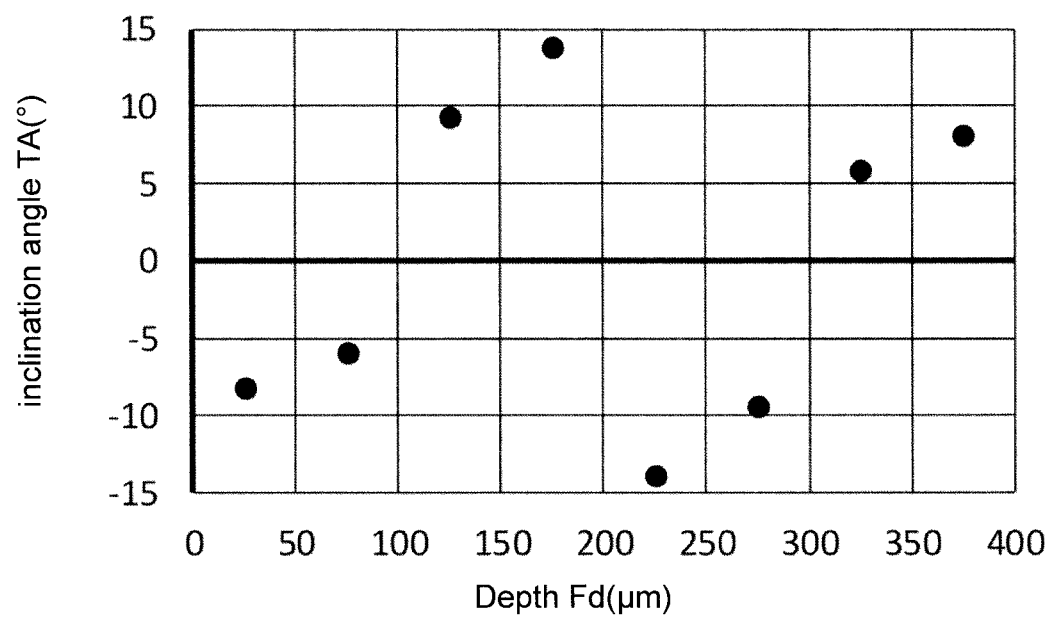
Figure 28:
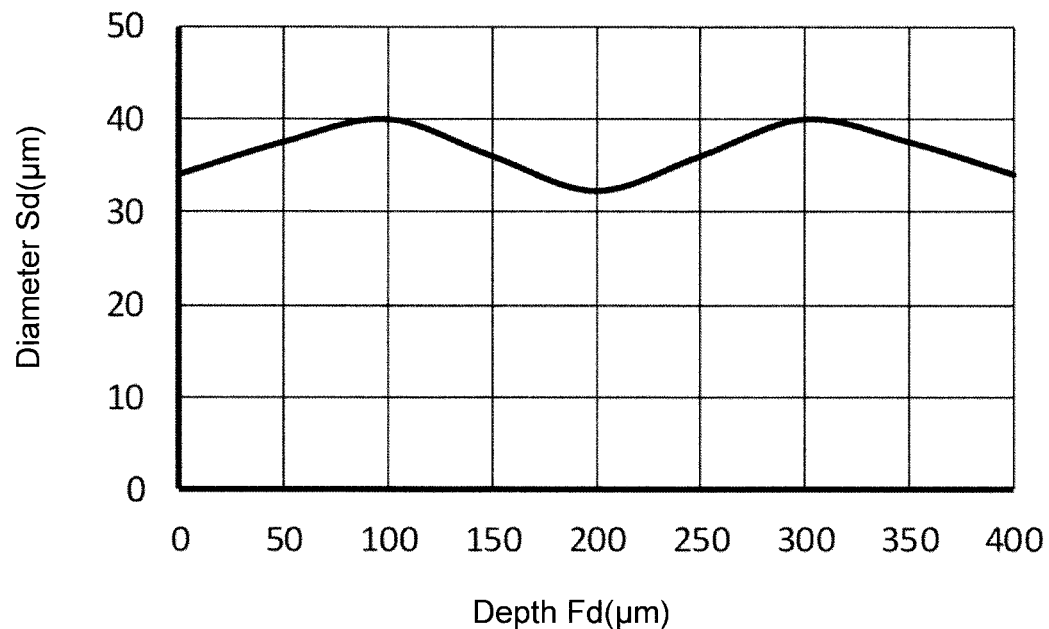
FIG. 28 is graphs illustrating shape properties of the through hole in Fourth Example (shape D2) of the present disclosure.
Figure 28:
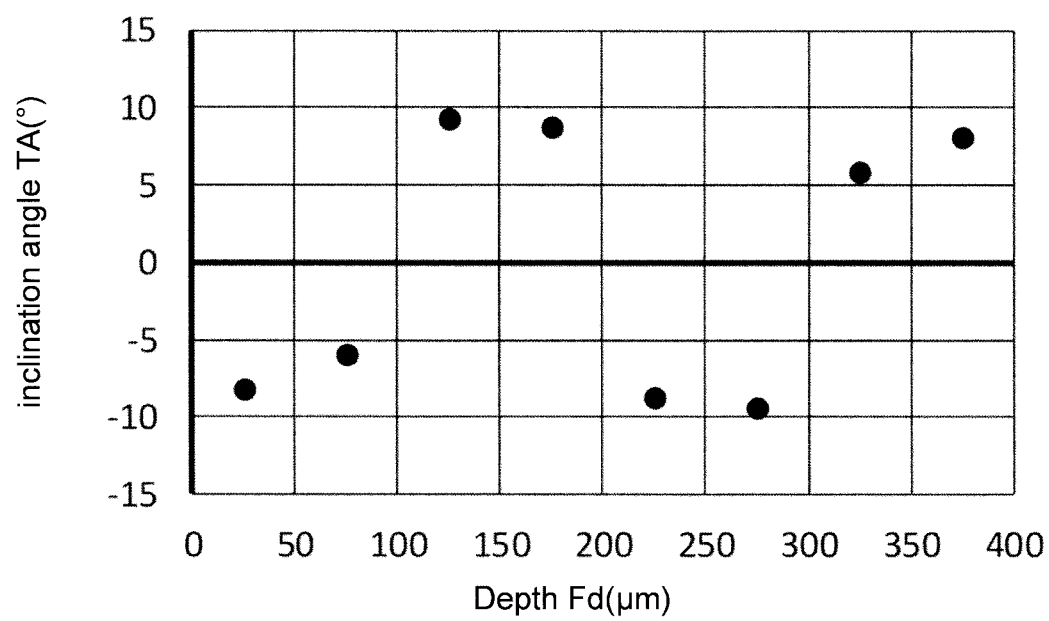
Figure 29:
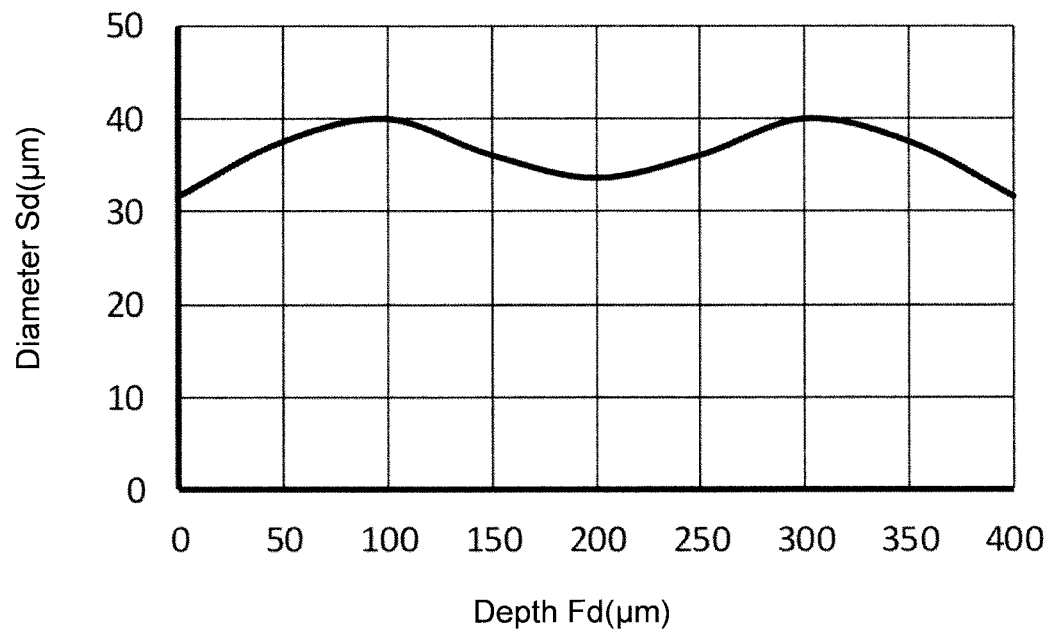
FIG. 29 is graphs illustrating shape properties of the through hole in Fourth Comparative Example (shape D3) of the present disclosure.
Figure 29:
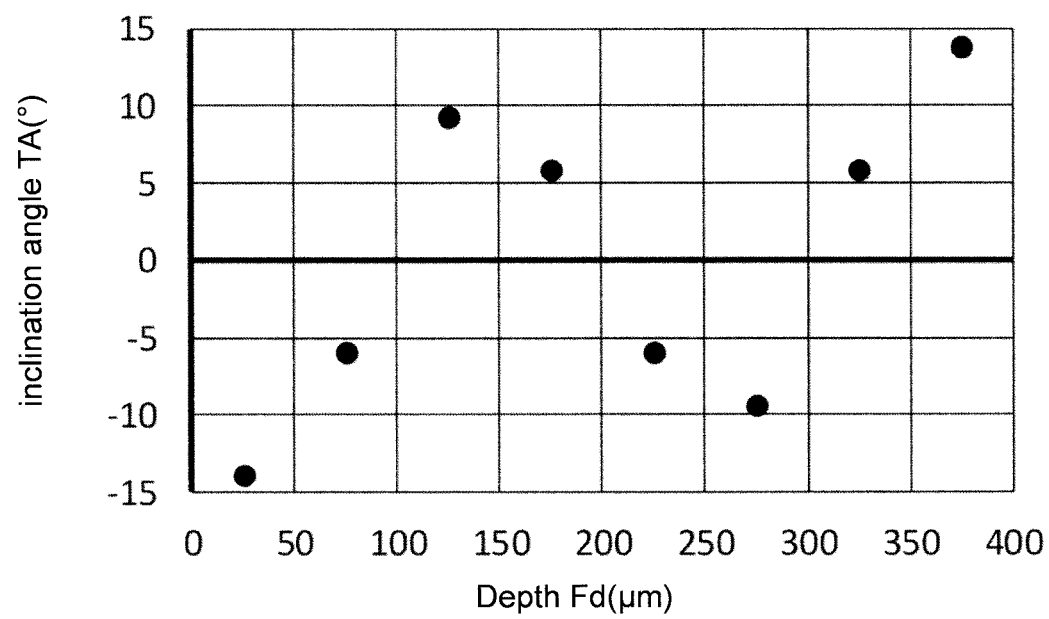
Figure 30:
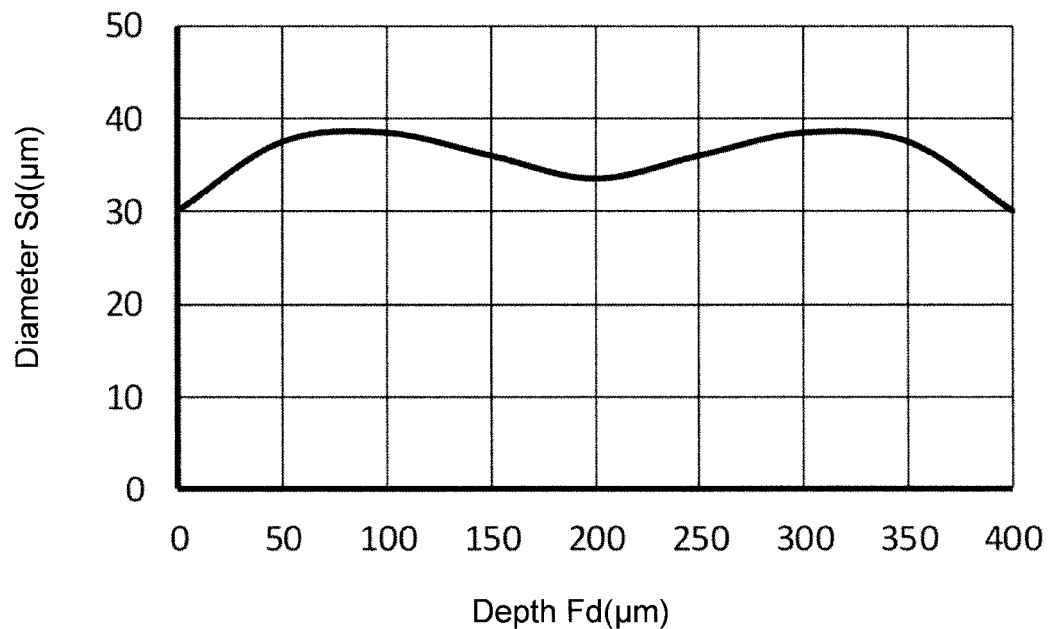
FIG. 30 is a view illustrating shape properties of the through hole in Fourth Comparative Example (shape D4) of the present disclosure.
Figure 30:
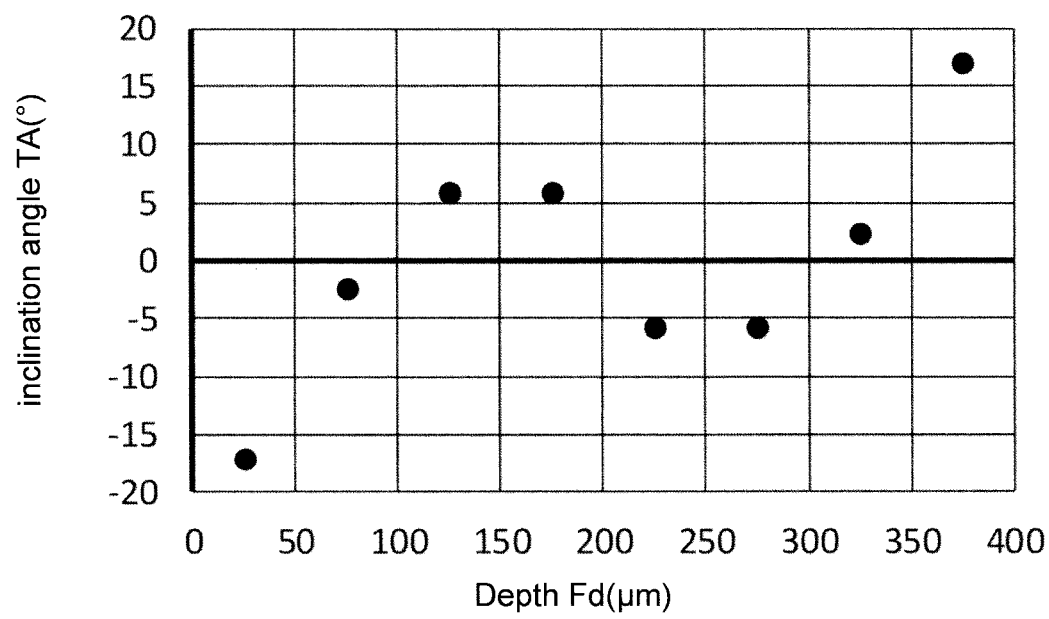

FIG. 27 is graphs illustrating shape properties of a through hole in Fourth Example (shape D1) of the present disclosure. FIG. 28 is graphs illustrating shape properties of a through hole in Fourth Example (shape D2) of the present disclosure. FIG. 29 is graphs illustrating shape properties of a through hole in Fourth Comparative Example (shape D3) of the present disclosure. FIG. 30 is graphs illustrating shape properties of a through hole in Fourth Example (shape D4) of the present disclosure. The shape properties of the through hole shown in FIG. 27 to FIG. 30 include a relationship between the depth Fd and the diameter Sd and a relationship between the depth Fd and the inclination angle TA. In the evaluation method, whether or not the first metal layer 51 was formed on the entire inner face of the through hole 150D was evaluated in the same manner as described above.

It was judged that the shapes D1, D2 were good while the shapes D3, D4 were not good.

Fifth Example

Regarding various shapes of the through hole 150E assuming the shape E, influence on forming the first metal layer 51 was evaluated. Here, a through hole having a shape E1 was formed as Fifth Example. The irradiation condition in this shape is as shown in the following Table 6.

TABLE 6

| Irradiation Condition of Laser Light (Shape E) | |
|---|---|
| | E1 |
| Inlet Aperture Diameter (μm) | 75 |
| Intermediate Aperture Diameter (μm) | −75 |
| Irradiation Time (msec.) | 25 |

Figure 31:
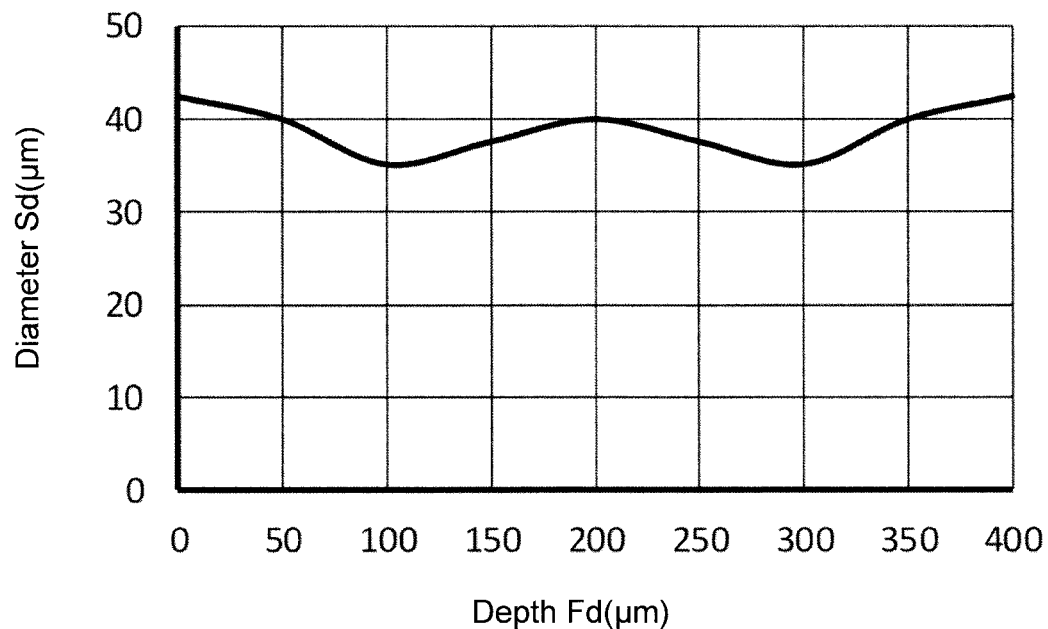
FIG. 31 is graphs illustrating shape properties of the through hole in Fifth Example (shape E1) of the present disclosure.
Figure 31:
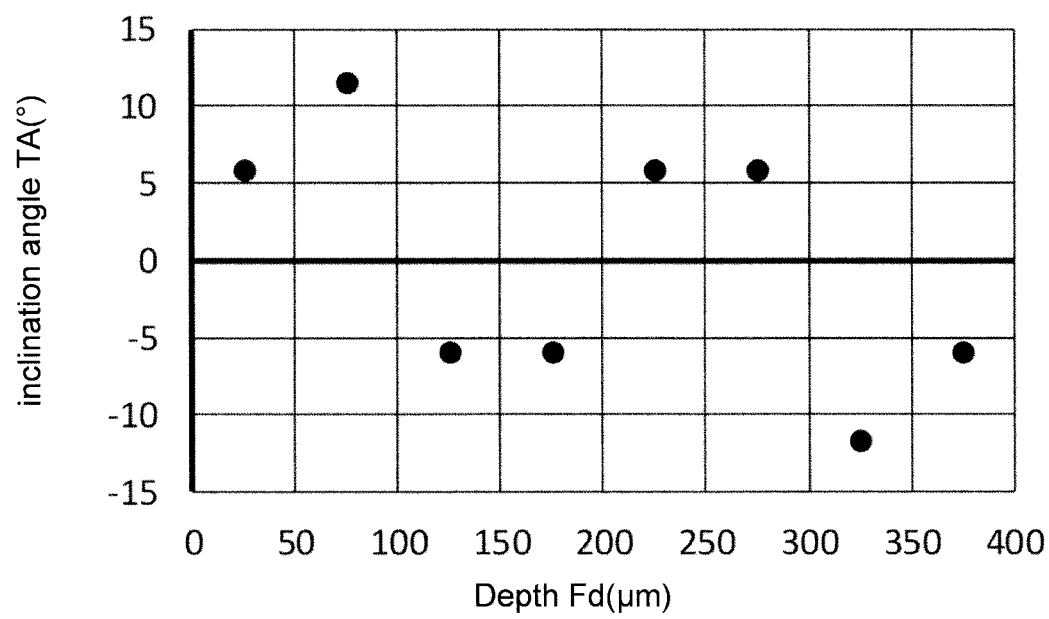

FIG. 31 is graphs illustrating shape properties of a through hole in Fifth Example (shape E1) of the present disclosure. The shape properties of the through hole shown in FIG. 31 include a relationship between the depth Fd and the diameter Sd and a relationship between the depth Fd and the inclination angle TA. In the evaluation method, whether or not the first metal layer 51 was formed on the entire inner face of the through hole 150E was evaluated in the same manner as described above.

As a result, it was judged that the shape E1 was good.

Relationship Between Evaluation Result and
Inclination Angle (With Minimum Value of
Diameter Sd)

From the evaluation results obtained from Third Example, Third Comparative Example, Fourth Example, Fourth Comparative Example and Fifth Example described above, it was found that when a total value TSA of the inclination angles TA satisfied a predetermined condition, a good evaluation result could be obtained. The inclination angle total value TSA is a total value obtained by summing the inclination angles TA at four points. A relationship between the inclination angle total value TSA and the evaluation result with respect to each shape is shown in the following Table 7. Measurement positions of the inclination angles TA are positions at four points corresponding to distances of 6.25% (25 μm), 18.75% (75 μm), 31.25% (125 μm), 43.75% (175 μm) from the first face 101 in a section from the first face 101 to the second face 102.

It is to be noted that regarding the through holes having the shapes C, D, E, the first face 101 side and the second face 102 side is in a symmetrical relationship with respect to the middle (50%, 200 μm) of the through hole. Therefore, when the measurement positions of the inclination angles TA are positions at four points corresponding to distances of 56.25% (225 μm), 68.75% (275 μm), 81.25% (325 μm), and 93.75% (375 μm) from the first face 101 in a section from the first face 101 to the second face 102, the inclination angle total value TSA becomes a value the plus or minus sign of which was reversed.

TABLE 7

Inclination Angle Total Value TSA and Evaluation
Result with respect to Each Shape

| Shape | Inclination Angle Total Value TSA (°) | Evaluation Result |
|---|---|---|
| C1 | 23.31 | Good |
| C2 | 11.71 | Good |
| C3 | 4.10 | Good |
| C4 | 3.05 | Not Good |
| D1 | 9.11 | Good |
| D2 | 4.03 | Good |
| D3 | −4.51 | Not Good |
| D4 | −7.74 | Not Good |
| E1 | 5.73 | Good |

As shown in Table 7, when the inclination angle total value TSA at the four measurement points (corresponding to distances of 6.25% (25 μm), 18.75% (75 μm), 31.25% (125 μm), 43.75% (175 μm) from the first face 101 in a section from the first face 101 to the second face 102) is 4° or more, the evaluation result is good. At this time, eventually, when the inclination angle total value TSA at the four measurement points (corresponding to distances of 56.25% (225 μm), 68.75% (275 μm), 81.25% (325 μm), and 93.75% (375 μm) from the first face 101 in a section from the first face 101 to the second face 102) is −4° or less, the evaluation result is good. This shows that the above-described through hole 150 has a shape satisfying the "second conditions".

Second Embodiment

In a second embodiment, a semiconductor device manufactured using the through electrode substrate 10 in the first embodiment is described.

Figure 32:
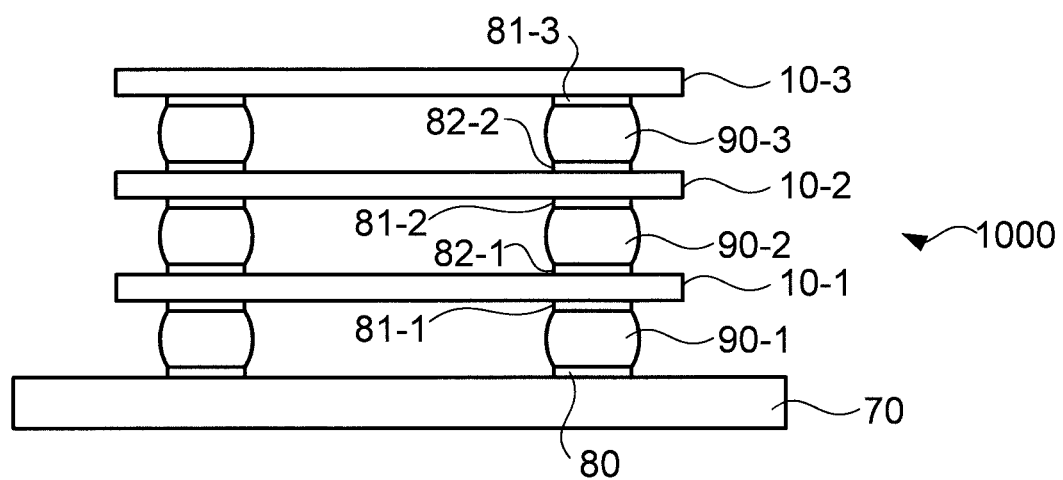
FIG. 32 is a view showing a semiconductor device according to a second embodiment of the present disclosure.

FIG. 32 is a view showing a semiconductor device according to the second embodiment of the present disclosure. A semiconductor device 1000 has three through electrode substrates 10 (10-1, 10-2, 10-3) stacked, and is connected to an LSI substrate 70. The through electrode substrate 10-1 has, for example, a semiconductor element such as a DRAM, and has connection terminals 81-1, 82-1 formed of the conduction layers 212, 222 and the like. These through electrode substrates 10 (10-1, 10-2, 10-3) may be manufactured by using the glass substrate 100, or some through electrode substrates 10 may be manufactured by using a substrate made from a material different from a material of the other through electrode substrates 10. The connection terminal 81-1 is connected to a connection terminal 80 of the LSI substrate 70 via a bump 90-1. The connection terminal 82-1 is connected to the connection terminal 81-2 of the through electrode substrate 10-2 via a bump 90-2. The connection terminal 82-2 of the through electrode substrate 10-2 and the connection terminal 83-1 of the through electrode terminal 10-3 are also connected to each other via a bump 90-3. As the bumps 90 (90-1, 90-2, 90-3) such metal as, for example, indium, copper or gold or like is used.

It is to be noted that, when the through electrode substrates 10 are stacked, the number of layers is not limited to three, but it may be two layers or furthermore may be four or more layers. Further, connection of the through electrode substrate 10 to another substrate is not limited to the case where the connection is performed via the bump, but it may be performed by using another bonding technique, such as eutectic bonding. In addition, the through electrode substrate 10 and another substrate may be bonded together by applying polyimide, epoxy resin or the like and baking the same.

Figure 33:
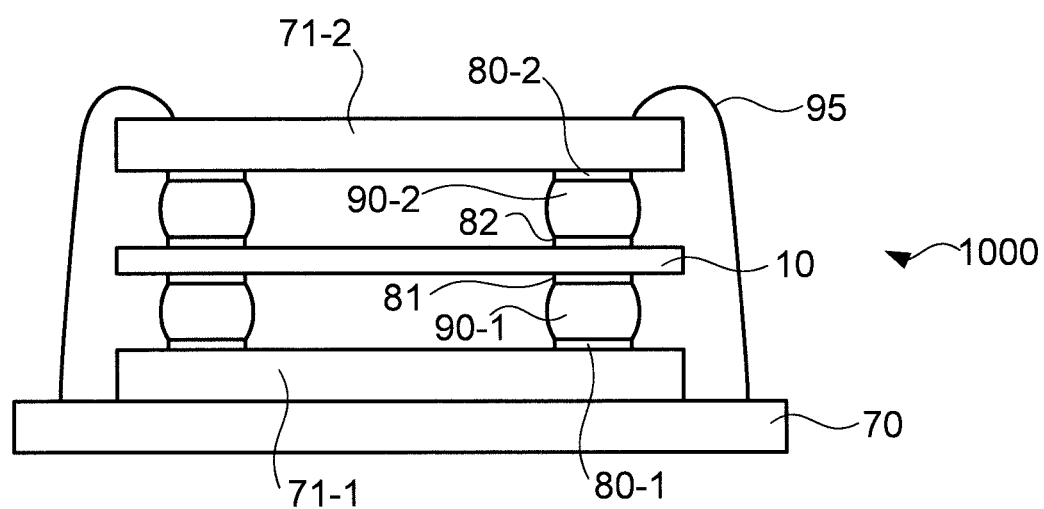
FIG. 33 is a view showing another example of the semiconductor device according to the second embodiment of the present disclosure.

FIG. 33 is a view showing another example of the semiconductor device according to the second embodiment of the present disclosure. The semiconductor device 1000 shown in FIG. 33 has a stacked structure obtained by stacking semiconductor circuit substrates (semiconductor chips) 71-1, 71-2, such as an MEMS device, a CPU, or a memory, and the through electrode substrate 10, and is connected to the LSI substrate 70.

The through electrode substrate 10 is arranged between the semiconductor circuit substrate 71-1 and the semiconductor circuit substrate 71-2, and is connected thereto via the bumps 90-1 and 90-2, respectively. The semiconductor circuit substrate 71-1 is mounted on the LSI substrate 70. The LSI substrate 70 and the semiconductor circuit substrate 71-2 are connected to each other via wires 95. In this example, the through electrode substrate 10 is used as an interposer for three-dimensional mounting by stacking a plurality of semiconductor circuit substrates. The through electrode substrate 10 is connected to a plurality of semiconductor circuit substrates each having different functions, so that a multi-functional semiconductor device can be obtained. For example, by using the semiconductor circuit substrate 71-1 as a three-axis acceleration sensor and using the semiconductor circuit substrate 71-2 as a two-axis magnetic sensor, a semiconductor device providing a five-axis motion sensor in one module can be obtained.

When a semiconductor circuit substrate is a senor made of an MEMS device, or the like, a sensing result may be outputted as an analog signal. In this case, a low-pass filter, an amplifier, or the like, may be formed in the semiconductor circuit substrate or the through electrode substrate 10.

Figure 34:
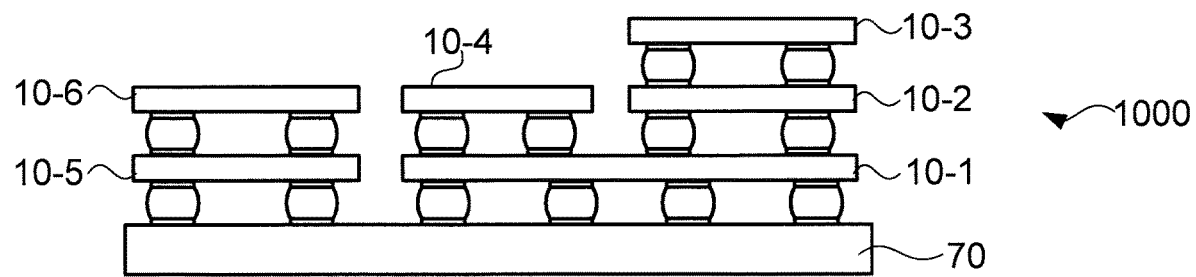
FIG. 34 is a view showing still another example of the semiconductor device according to the second embodiment of the present disclosure.

FIG. 34 is a view showing another example of the semiconductor device according to the second embodiment of the present disclosure. The two examples (FIG. 32, FIG.

33) described above are the 3-dimensional mounting, but this example is an example of application to 2.5-demensional mounting. In the example shown in FIG. 34, six through hole substrates 10 (10-1 to 10-6) are stacked and connected on the LSI substrate 70. However, all the through hole substrates 10 are not only arranged in a stacking manner but are also arranged side by side in in-plane direction of the substrates.

In the example shown in FIG. 34, the through electrode substrates 10-1, 10-5 are connected on to the LSI substrate 70, the through electrode substrates 10-2, 10-4 are connected on to the through electrode substrate 10-1, the through electrode substrate 10-3 is connected on to the through electrode substrate 10-2, and the through electrode substrate 10-6 is connected on to the through electrode substrate 10-5. It is to be noted that, also when the through electrode substrate 10 is used as an interposer for connecting a plurality of semiconductor circuit substrates, like the example shown in FIG. 33, 2.5-demensional mounting is applicable. For example, the through electrode substrate 10-3, 10-4, 10-6, or the like, may be replaced with a semiconductor circuit substrate.

The semiconductor device 1000 thus manufactured is mounted on various kinds of electric equipment, for example, a mobile terminal (such as a mobile phone, a smartphone and a laptop-type personal compute), an information processing device (a desktop-type personal computer, a server, a car navigation system, or the like), a home electrical appliance, or the like.

Figure 35:
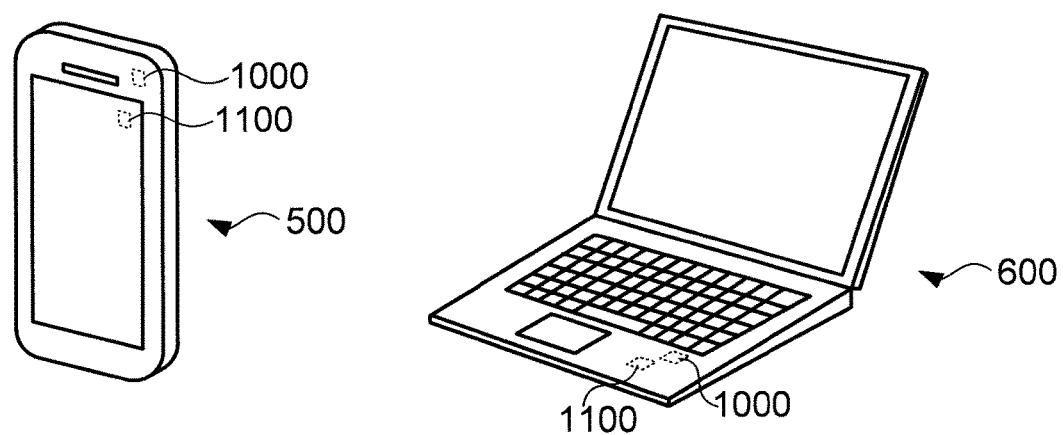
FIG. 35 is a view illustrating electronic equipment including the semiconductor device according to the second embodiment of the present disclosure.

FIG. 35 is a view showing electronic equipment including the semiconductor device according to the second embodiment of the present disclosure. The semiconductor device 1000 is mounted on various kinds of electric equipment, for example, a mobile terminal (such as a mobile phone, a smartphone and a laptop-type personal computer), an information processing device (a desktop-type personal computer, a server, a car navigation system, or the like), a home electrical appliance, or the like. As examples of the electrical equipment mounted with the semiconductor device 1000, a smartphone 500 and a laptop-type personal computer 600 are shown. These pieces of electrical equipment have a controller 1100 composed of a CPU or the like for executing an application program to achieve various functions. The various functions include a function using an output signal from the semiconductor device 1000. It is to be noted that the semiconductor device 1000 may have the function of the controller 1100.

What is claimed is:

1. A through electrode substrate comprising:
a substrate having a first face and a second face, the substrate having a through hole extending through between the first face and the second face, a diameter of the through hole not having a minimum value inside of the through hole, such that the inside of the through hole is defined by an area between a top edge of a first opening of the through hole and a bottom edge of a second opening of the through hole; and
a conductor arranged along an inner face of the through hole, wherein
an insulation region surrounded by the conductor is arranged inside the through hole,
the through hole has a shape such that a first inclination angle to an eighth inclination angle at a first position to an eighth position are decreasing gradually,
each of the first inclination angle to the eighth inclination angle is an angle of the inner face with respect to a center axis of the through hole, and an angle expanding toward the first face is defined as a positive, and
the first position to the eighth position corresponds to positions at distances of 6.25%, 18.75%, 31.25%, 43.75%, 56.25%, 68.75%, 81.25%, and 93.75%, respectively, from the first face in a section from the first face to the second face.

2. The through electrode substrate according to claim 1, wherein the insulation region is a region filled with an insulator.

3. The through electrode substrate according to claim 2, wherein the insulator includes a resin.

4. The through electrode substrate according to claim 1, wherein
the conductor includes a first metal layer and a second metal layer,
the first metal layer is arranged between the second metal layer and the substrate, and
the first metal layer is arranged in at least a portion of both the first face and the second face.

5. The through electrode substrate according to claim 4, wherein at least a portion of the first metal layer arranged in the first face and the second face is connected to the first metal layer arranged inside the through hole.

6. The through electrode substrate according to claim 1, wherein the substrate is a glass substrate.

7. The through electrode substrate according to claim 1, wherein the conductor includes a first metal layer arranged on the substrate and a second metal layer arranged on the first metal layer.

8. The through electrode substrate according to claim 1, wherein an aspect ratio of the through hole is 4 or more.

9. A semiconductor device comprising:
the through electrode substrate according to claim 1; and
a semiconductor circuit substrate electrically connected to the conductor of the through electrode substrate.

10. A through electrode substrate comprising:
a substrate having a first face and a second face, the substrate having a through hole extending through between the first face and the second face; a diameter of the through hole having a minimum value inside the through hole; and
a conductor arranged along an inner face of the through hole, wherein
an insulation region surrounded by the conductor is arranged inside the through hole,
the through hole has a shape such that a first inclination angle to a fourth inclination angle at a first position to a fourth position is decreasing gradually, and a fifth inclination angle to an eighth inclination angle at a fifth position to an eighth position is increasing gradually;
each of the first inclination angle to the eighth inclination angle is an angle of the inner face with respect to a center axis of the through hole, and an angle expanding toward the first face is defined as a positive, and
the first position to the eighth position corresponds to positions at distances of 6.25%, 18.75%, 31.25%; 43.75%; 56.25%, 68.75%, 81.25%, and 93.75%; respectively, from the first face in a section from the first face to the second face.

11. The through electrode substrate according to claim 10, wherein the insulation region is a region filled with an insulator.

12. The through electrode substrate according to claim 11, wherein the insulator includes a resin.

13. The through electrode substrate according to claim 10, wherein the conductor includes a first metal layer and a second metal layer, the first metal layer is arranged between the second metal layer and the substrate, and the first metal layer is arranged at least in a portion of both the first face and the second face.

14. The through electrode substrate according to claim 10, wherein at least portions of the first metal layer arranged in the first face and the second face are connected to the first metal layer arranged inside the through hole.

15. The through electrode substrate according to claim 10, wherein the substrate is a glass substrate.

16. The through electrode substrate according to claim 10, wherein the conductor includes a first metal layer arranged on the substrate and a second metal layer arranged on the first metal layer.

17. The through electrode substrate according to claim 10, wherein an aspect ratio of the through hole is 4 or more.

18. A semiconductor device comprising the through electrode substrate according to claim 10, and a semiconductor circuit substrate electrically connected to the conductor of the through electrode substrate.

* * * * *